US008002948B2

(12) United States Patent
Haubrich et al.

(10) Patent No.: US 8,002,948 B2
(45) Date of Patent: *Aug. 23, 2011

(54) PROCESS FOR FORMING A PATTERNED THIN FILM STRUCTURE ON A SUBSTRATE

(75) Inventors: Jeanne E. Haubrich, Clifton Park, NY (US); Yi-Shung Chaug, Cupertino, CA (US); Zarng-Arh George Wu, San Diego, CA (US); Rong-Chang Liang, Cupertino, CA (US); Xiaojia Wang, Fremont, CA (US)

(73) Assignees: SiPix Imaging, Inc., Fremont, CA (US); Etansi Inc., Chung-Li, Taoyuan County (TW)

( * ) Notice: Subject to any disclaimer, the term of this patent is extended or adjusted under 35 U.S.C. 154(b) by 997 days.

This patent is subject to a terminal disclaimer.

(21) Appl. No.: 11/777,083

(22) Filed: Jul. 12, 2007
(Under 37 CFR 1.47)

(65) Prior Publication Data
US 2008/0075839 A1 Mar. 27, 2008

Related U.S. Application Data

(63) Continuation-in-part of application No. 10/666,912, filed on Sep. 19, 2003, now Pat. No. 7,261,920, which is a continuation-in-part of application No. 10/422,557, filed on Apr. 23, 2003, now abandoned, application No. 11/777,083, which is a continuation-in-part of application No. 11/612,364, filed on Dec. 18, 2006.

(60) Provisional application No. 60/375,902, filed on Apr. 24, 2002.

(51) Int. Cl.
*B05D 1/32* (2006.01)
*B05D 3/10* (2006.01)
*B05D 5/12* (2006.01)
*H01L 21/31* (2006.01)
*H01L 21/36* (2006.01)
*B32B 37/10* (2006.01)
*B32B 43/00* (2006.01)

(52) U.S. Cl. ........ 156/703; 156/277; 156/278; 156/247; 156/704; 156/705; 427/259; 427/272; 427/273; 427/282; 438/478; 438/759; 438/763

(58) Field of Classification Search .................. 156/344, 156/247, 277, 278, 584, 703, 704, 705; 427/154, 427/155, 156, 272, 273, 274, 282, 259; 101/114, 101/128.21, 129; 118/504; 438/478, 759, 438/763
See application file for complete search history.

(56) References Cited

U.S. PATENT DOCUMENTS
3,612,758 A 10/1971 Evans et al.
(Continued)

FOREIGN PATENT DOCUMENTS
CN 1217629 5/1999
(Continued)

OTHER PUBLICATIONS
English Abstract of JP 10-324157.*
(Continued)

*Primary Examiner* — Philip C Tucker
*Assistant Examiner* — Sing P Chan
(74) *Attorney, Agent, or Firm* — Perkins Coie LLP

(57) ABSTRACT

A process for forming a patterned thin film structure on a substrate is disclosed. A pattern is printed with a material, such as a masking coating or an ink, on the substrate, the pattern being such that, in one embodiment, the desired thin film structures will be formed in the areas where the printed material is not present, i.e., a negative image of thin film structure to be formed is printed. In another embodiment, the pattern is printed with a material that is difficult to strip from the substrate, and the desired thin film structures will be formed in the areas where the printed material is present, i.e., a positive image of the thin film structure is printed. The thin film material is deposited on the patterned substrate, and the undesired area is stripped, leaving behind the patterned thin film structures.

32 Claims, 16 Drawing Sheets

U.S. PATENT DOCUMENTS

| | | | |
|---|---|---|---|
| 3,668,106 | A | 6/1972 | Ota |
| 3,697,679 | A | 10/1972 | Hathaway |
| 3,935,334 | A | 1/1976 | Narui et al. |
| 3,968,278 | A * | 7/1976 | Wells .............................. 427/258 |
| 4,022,927 | A | 5/1977 | Pfeiffer et al. |
| 4,071,430 | A | 1/1978 | Liebert |
| 4,078,935 | A | 3/1978 | Nakagiri et al. |
| 4,093,534 | A | 6/1978 | Carter et al. |
| 4,119,483 | A | 10/1978 | Hubsch et al. |
| 4,217,182 | A | 8/1980 | Cross |
| 4,285,801 | A | 8/1981 | Chiang |
| 4,345,000 | A | 8/1982 | Kawazoe et al. |
| 4,368,281 | A | 1/1983 | Brummett et al. |
| 4,420,515 | A | 12/1983 | Amon et al. |
| 4,586,980 | A | 5/1986 | Hirai et al. |
| 4,643,912 | A | 2/1987 | Nakagawa et al. |
| 4,652,090 | A * | 3/1987 | Uchikawa et al. ............ 359/267 |
| 4,655,897 | A | 4/1987 | DiSanto et al. |
| 4,663,192 | A | 5/1987 | Hatakeyama et al. |
| 4,680,103 | A | 7/1987 | Beilin et al. |
| 4,714,631 | A | 12/1987 | Aufderheide |
| 4,741,988 | A | 5/1988 | Van der Zande et al. |
| 4,910,045 | A | 3/1990 | Giesecke et al. |
| 4,977,013 | A | 12/1990 | Ritchie et al. |
| 4,995,718 | A | 2/1991 | Jachimowicz et al. |
| 5,102,497 | A | 4/1992 | Hamaguchi et al. |
| 5,177,476 | A | 1/1993 | DiSanto et al. |
| 5,229,167 | A | 7/1993 | Tsukamoto |
| 5,276,438 | A | 1/1994 | DiSanto et al. |
| 5,279,511 | A | 1/1994 | DiSanto et al. |
| 5,368,902 | A | 11/1994 | Todd et al. |
| 5,380,362 | A | 1/1995 | Schubert |
| 5,403,518 | A | 4/1995 | Schubert |
| 5,436,034 | A | 7/1995 | Giesecke et al. |
| 5,460,922 | A | 10/1995 | Swirbel et al. |
| 5,495,981 | A | 3/1996 | Warther |
| 5,573,711 | A | 11/1996 | Hou et al. |
| 5,589,100 | A | 12/1996 | Grasso et al. |
| 5,699,097 | A | 12/1997 | Takayama et al. |
| 5,795,527 | A | 8/1998 | Nakamura et al. |
| 5,835,174 | A | 11/1998 | Clikeman et al. |
| 5,837,609 | A | 11/1998 | Todd et al. |
| 5,888,372 | A | 3/1999 | Bollens et al. |
| 5,914,806 | A | 6/1999 | Gordon II et al. |
| 5,930,026 | A | 7/1999 | Jacobson et al. |
| 5,961,804 | A | 10/1999 | Jacobson et al. |
| 5,976,405 | A | 11/1999 | Clikeman et al. |
| 6,017,584 | A | 1/2000 | Albert et al. |
| 6,037,058 | A | 3/2000 | Clikeman et al. |
| 6,067,185 | A | 5/2000 | Albert et al. |
| 6,080,606 | A | 6/2000 | Gleskova et al. |
| 6,111,598 | A | 8/2000 | Faris |
| 6,113,810 | A | 9/2000 | Hou et al. |
| 6,117,300 | A | 9/2000 | Carbin et al. |
| 6,120,588 | A | 9/2000 | Jacobson |
| 6,120,839 | A | 9/2000 | Comiskey et al. |
| 6,131,512 | A | 10/2000 | Verlinden et al. |
| 6,140,025 | A | 10/2000 | Imai et al. |
| 6,172,798 | B1 | 1/2001 | Albert et al. |
| 6,184,856 | B1 | 2/2001 | Gordon, II et al. |
| 6,232,950 | B1 | 5/2001 | Albert et al. |
| 6,252,624 | B1 | 6/2001 | Yuasa et al. |
| 6,294,218 | B1 | 9/2001 | Igel et al. |
| 6,312,304 | B1 | 11/2001 | Duthaler et al. |
| 6,327,072 | B1 | 12/2001 | Comiskey et al. |
| 6,337,761 | B1 | 1/2002 | Rogers et al. |
| 6,392,786 | B1 | 5/2002 | Albert |
| 6,426,143 | B1 | 7/2002 | Voss et al. |
| 6,490,021 | B1 | 12/2002 | Koyama |
| 6,507,376 | B2 | 1/2003 | Nakamura |
| 6,672,921 | B1 | 1/2004 | Liang et al. |
| 6,781,745 | B2 | 8/2004 | Chung et al. |
| 6,795,138 | B2 | 9/2004 | Liang et al. |
| 6,885,495 | B2 | 4/2005 | Liang et al. |
| 6,909,532 | B2 | 6/2005 | Chung et al. |
| 6,930,818 | B1 | 8/2005 | Liang et al. |
| 6,933,098 | B2 | 8/2005 | Chan-Park et al. |
| 7,046,228 | B2 | 5/2006 | Liang et al. |
| 7,261,920 | B2 | 8/2007 | Haubrich et al. |
| 2001/0032828 | A1 | 10/2001 | Appelt et al. |
| 2002/0083858 | A1 | 7/2002 | MacDiarmid et al. |
| 2002/0196390 | A1 | 12/2002 | Penterman et al. |
| 2003/0038772 | A1 | 2/2003 | De Boer et al. |
| 2003/0203101 | A1 | 10/2003 | Haubrich et al. |

FOREIGN PATENT DOCUMENTS

| | | |
|---|---|---|
| EP | 0 390 465 | 10/1990 |
| EP | 1 089 117 | 4/2001 |
| GB | 2 207 289 | 1/1989 |
| JP | 57-177029 | 10/1982 |
| JP | 59-171930 | 9/1984 |
| JP | H02-253692 | 10/1990 |
| JP | 03-084521 | 4/1991 |
| JP | 09-254332 | 9/1997 |
| JP | 10324517 A * | 12/1998 |
| JP | 2000-038685 | 2/2000 |
| WO | WO 99/56171 | 11/1999 |
| WO | WO 00/36465 | 6/2000 |
| WO | WO 00/60410 | 10/2000 |
| WO | WO 01/67170 | 9/2001 |
| WO | WO 02/01281 | 1/2002 |
| WO | WO 03/091788 | 11/2003 |

OTHER PUBLICATIONS

Machine English Translation of JP 10-324157.*

Allen, K. (Oct. 2003). Electrophoretics Fulfilled. *Emerging Displays Review: Emerging Display Technologies, Monthly Report*—Oct. 2003, 9-14.

Bardsley, J.N. & Pinnel, M.R. (Nov. 2004) Microcup™ Electrophoretic Displays. *USDC Flexible Display Report*, 3.1.2. pp. 3-12-3-16.

Chaug, Y.S., Haubrich, J.E., Sereda, M. and Liang, R.C. (Apr. 2004). Roll-to-Roll Processes for the Manufacturing of Patterned Conductive Electrodes on Flexible Substrates. *Mat. Res. Soc. Symp. Proc.*, vol. 814, I9.6.1.

Chen, S.M. (Jul. 2003) The Applications for the Revolutionary Electronic Paper Technology. *OPTO News & Letters*, 102, 37-41. (in Chinese, English abstract attached).

Chung, J., Hou, J., Wang, W., Chu, L.Y., Yao, W., & Liang, R.C. (Dec. 2003). Microcup® Electrophoretic Displays, Grayscale and Color Rendition. *IDW*, AMD2/EP1-2, 243-246.

Comiskey et al, "An Electrophoretic Ink for All-printed Reflective Electronic Displays", Letters to Nature, MIT, The Media Laboratory, 20 Ames Street, Cambridge, MA 02139-4307, USA, May 1998, pp. 253-255.

Dalisa, A. L., "Electrophoretic Display Technology", IEEE Trans. Electron Devices, pp. 827-834 (1977).

Drzaic, P.S., "Liquid Crystal Dispersions", The PDLC Paradigm, pp. 1-9, (1995).

Harbour, J. R., "Subdivided Electrophoretic Display" Xerox Disclosure Journal, US Xerox Corporation, Stamford, Conn., 4(6):705, Nov. 1979, XP002123212.

Harvey, T.G., "Replication Techniques for Micro-optics", SPIE Proc., vol. 3099, pp. 76-82 (1997).

Ho, Andrew. (Nov. 2006) *Embedding e-Paper in Smart Cards, Pricing Labels & Indicators.* Presentation conducted at Smart Paper Conference Nov. 15-16, 2006, Atlanta, GA.

Ho, C.,& Liang, R.C. (Dec. 2003). *Microcup® Electronic Paper by Roll-to-Roll Manufacturing Processes.* Presentation conducted at FEG, Nei-Li, Taiwan.

Ho, Candice. (Feb. 1, 2005) *Microcupt® Electronic Paper Device and Applicaiton.* Presentation conducted at USDC 4th Annual Flexible Display Conference 2005.

Hopper, M. A. et al, "An Electrophoretic Display, its Properties, Model and Addressing", IEEE Transactions on Electron Devices, 26(8): 1148-1152 (1979).

Hou, J., Chen, Y., Li, Y., Weng, X., Li, H. And Pereira, C. (May 2004). Reliability and Performance of Flexible Electrophoretic Displays by Roll-to-Roll Manufacturing Processes. *SID Digest*, 32.3, 1066-1069.

Inoue, et al "Low Temperature Poly-Si TFT—Electrophoretic Displays (TFT-EPDs) with Four Level Gray Scale", Int'l Electron Devices Meeting 2000, Technical Digest San Francisco, California, Dec. 10-13. 2000, pp. 197-200.

Lee, H., & Liang, R.C. (Jun. 2003) SiPix Microcup® Electronic Paper—An Introduction. *Advanced Display*, Issue 37, 4-9 (in Chinese, English abstract attached).

Lewis, et al., "Gravitational, Inter-Particle and Particle-Electrode Forces in Electrophoretic Display", Poceeding of the SID, vol. 18/3& 4, 1977.

Liang, R.C. (Feb. 2003) *Microcup(R) Electrophoretic and Liquid Crystal Displays by Roll-to-Roll Manufacturing Processes*. Presentation conducted at the Flexible Microelectronics & Displays Conference of U.S. Display Consortium, Phoenix, Arizona, USA.

Liang, R.C. (Apr. 2004). *Microcup Electronic Paper by Roll-to-Roll Manufacturing Process*. Presentation at the Flexible Displays & Electronics 2004 of Intertech, San Fransisco, California, USA.

Liang, R.C. (Oct. 2004) *Flexible and Roll-able Displays/Electronic Paper—A Technology Overview*. Paper presented at the METS 2004 Conference in Taipie, Taiwan.

Liang, R.C., & Tseng, S. (Feb. 2003). *Microcup(R) LCD, An New Type of Dispersed LCD by A Roll-to-Roll Manufacturing Process*. Paper presented at the IDMC, Taipei, Taiwan.

Liang, R.C., (Feb. 2005) *Flexible and Roll-able Displays/Electronic Paper—A Brief Technology Overview*. Flexible Display Forum, 2005, Taiwan.

Liang, R.C., Hou, J., & Zang, H.M. (Dec. 2002) Microcup Electrophoretic Displays by Roll-to-Roll Manufacturing Processes. *IDW*, EP2-2, 1337-1340.

Liang, R.C., Hou, J., Chung, J., Wang, X., Pereira, C., & Chen, Y. (2003). Microcup(R) Active and Passive Matrix Electrophoretic Displays by A Roll-to-Roll Manufacturing Processes. *SID Digest*, 20.1.

Liang, R.C., Hou, J., Zang, H.M., & Chung, J. (Feb. 2003). *Passive Matrix Microcup(R) Electrophoretic Displays*. Paper presented at the IDMC, Taipei, Taiwan.

Liang, R.C., Zang, H.M., Wang, X., Chung, J. & Lee, H., (Jun./Jul. 2004) << Format Flexible Mitrocup® Electronic Paper by Roll-to-Roll Manufacturing Process >>, Presentation conducted at the 14th FPD Manufacturing Technology EXPO & Conference.

Murau and Singer, "The Understanding and Elimination of Some Suspension Instabilities in an Electrophoretic Displa"., J. Appl. Phys. 49(9), pp. 4820-4829, 1978.

Nakamura, et al, "Development of Electrophoretic Display using Microencapsulated Suspension", NOK Corporation, Kanagawa, Japan & NOK Corporation, Ibaraki, Japan, SID 98 Digest, pp. 1014-1017.

Ota, et al., "Electrophoretic Image Display (EPID) Panel", *Proceedings of the IEEE*, pp. 832-836, Jul. 1973.

Singer, B. et al, "X-Y Addressable Electrophoretic Display", Proc. SID 18(3/4), pp. 255-266 (1977).

Slafer, W. D. et al, "Continuous Manufacturing of Thin Cover Sheet Optical Media", SPIE Proc., vol. 1663, pp. 324-335 (1992).

Wang, X., Kiluk, S., Chang, C., & Liang, R.C. (Feb. 2004). Mirocup® Electronic Paper and the Converting Processes. *ASID*, 10.1.2-26, 396-399, Nanjing, China.

Wang, X., Kiluk, S., Chang, C., & Liang, R.C., (Jun. 2004) Microcup® Electronic Paper and the Converting Processes. *Advanced Display*, Issue 43, 48-51 (in Chinese, with English abstract).

Wang, X., Li, P., Sodhi, D., Xu, T. and Bruner, S. et al., (Feb. 2006) *Inkjet Fabrication of Multi-Color Microcup® Electrophorectic Display*. the Flexible Microelectronics & Displays Conference of U.S. Display Consortium.

Wang, X., Zang, HM., and Li, P. (Jun. 2006) Roll-to-Roll Manufacturing Process for Full Color Electrophoretic film. *SID Digest*, 00pp. 1587-1589.

Zang, H.M, Hwang, J.J., Gu, H., Hou, J., Weng, X., Chen, Y., et al. (Jan. 2004). Threshold and Grayscale Stability of Microcup® Electronic Paper. *Proceeding of SPIE-IS&T Electronic Imaging, SPIE* vol. 5289, 102-108.

Zang, H.M. & Hou, Jack, (Feb. 2005) *Flexible Microcup® EPD by RTR Process*. Presentation conducted at $2^{nd}$ Annual Paper-Like Displays Conference, Feb. 9-11, 2005, St. Pete Beach, Florida.

Zang, H.M. (Oct. 2003). *Microcup® Electronic Paper by Roll-to-Roll Manufacturing Processes*. Presentation conducted at the Advisory Board Meeting, Bowling Green State University, Ohio, USA.

Zang, H.M. (Feb. 2004). *Microcup Electronic Paper*. Presentation conducted at the Displays & Microelectronics Conference of U.S. Display Consortium, Phoenix, Arizona, USA.

Zang, H.M., & Liang, R.C. (2003) Microcup Electronic Paper by Roll-to-Roll Manufacturing Processes. *The Spectrum*, 16(2), 16-21.

Zang, HM., (Feb. 2007) *Developms in Microcup® Flexible Displays*. Presidentaiton conducted at the 6th Annual Flexible Display and Microelectronics Conference, Phoenix, AZ Feb. 6-8.

Zang, HM., Wang, W., Sun, C., Gu, H., and Chen, Y. (May 2006) Monochrome and Area Color Microcup® EPDs by Roll-to-Roll Manufacturing Processes. *ICIS '06 International Congress of Imaging Science Final Program and Proceedings*, pp. 362-365.

\* cited by examiner

TOP VIEW

CROSS-SECTION

TOP VIEW

CROSS-SECTION

TOP VIEW

CROSS-SECTION

TOP VIEW

CROSS-SECTION

TOP VIEW

CROSS-SECTION

TOP VIEW

CROSS-SECTION

TOP VIEW

CROSS-SECTION

TOP VIEW

CROSS-SECTION

TOP VIEW

CROSS-SECTION

PROCESS FOR FORMING A PATTERNED THIN FILM STRUCTURE ON A SUBSTRATE

This application is a continuation-in-part of U.S. application Ser. No. 10/666,912, filed Sep. 19, 2003, now U.S. Pat. No. 7,261,920; which is a continuation-in-part of U.S. application Ser. No. 10/422,557, filed on Apr. 23, 2003, abandoned; which claims the benefit of U.S. Provisional Application Ser. No. 60/375,902, filed Apr. 24, 2002. This application is also a continuation-in-part of U.S. application Ser. No. 11/612,364, filed Dec. 18, 2006. The contents of all of the above-identified applications are incorporated herein by reference in their entirety.

FIELD OF THE INVENTION

The present invention relates generally to displays. A process for forming a patterned thin film layer on a substrate is disclosed.

BACKGROUND OF THE INVENTION

A plastic display, such as an electrophoretic display, typically comprises two electrodes, at least one of which is patterned, and a display medium layer. Biasing voltages typically are applied selectively to the electrodes to control the state of the portion(s) of the display medium associated with the electrodes being biased. For example, a typical passive matrix electrophoretic display may comprise an array of electrophoretic cells arranged in rows and columns and sandwiched between a top and bottom electrode layer. The top electrode layer may comprise, for example, a series of transparent column electrodes positioned over the columns of electrophoretic cells and the bottom electrode layer may comprise a series of row electrodes positioned beneath the rows of electrophoretic cells. Several types of passive matrix electrophoretic displays are described in U.S. Pat. No. 6,781,745, entitled "An Improved Electrophoretic Display with Gating Electrodes;" U.S. Pat. No. 7,046,228, entitled "An Improved Electrophoretic Display with Dual mode Switching;" and U.S. Pat. No. 6,885,495, entitled "An Improved Electrophoretic Display with In-Plane Switching;" all of which are hereby incorporated by reference for all purposes.

One typical prior art approach to fabricating the patterned electrode layer(s) for such a plastic display typically involves the use of photolithographic techniques and chemical etching. Conductor films useful for plastic display applications may be formed by a process such as laminating, electroplating, sputtering, vacuum deposition, or combinations of more than one process for forming a conductor film onto a plastic substrate. Useful thin film conductors include metal conductors such as, for example, aluminum, copper, zinc, tin, molybdenum, nickel, chromium, silver, gold, iron, indium, thallium, titanium, tantalum, tungsten, rhodium, palladium, platinum and/or cobalt, etc., and metal oxide conductors such as indium tin oxide (ITO) and indium zinc oxide (IZO), as well as alloys or multilayer composite films derived from the aforementioned metals and/or metal oxides, e.g., aluminum zinc oxide, gadolinium indium oxide, tin oxide, or fluorine-doped indium oxide. Further, the thin film structures described herein may comprise either a single layer thin film or a multilayer thin film. ITO films are of particularly interest in many applications because of their high degree of transmission in the visible light region. Useful plastic substrates include epoxy resins, polyimide, polysulfone, polyarylether, polycarbonate (PC), polyethylene terephthalate (PET), polyethylene terenaphthalate (PEN), poly(cyclic olefin), and their composites. The conductor-on-plastics films are typically patterned by a photolithographic process which comprises several time consuming and high cost steps including (1) coating the conductor film with photoresist; (2) patterning the photoresist by image-wise exposing it through a photomask to, for example, ultraviolet light; (3) "developing" the patterned image by removing the photoresist from either the exposed or the unexposed areas, depending on the type of photoresist used, to uncover the conductor film in areas from which it is to be removed (i.e., areas where no electrode or other conductive structures is to be located); (4) using a chemical etching process to remove the conductor film from the areas from which the photoresist has been removed; and (5) stripping the remaining photoresist to uncover the electrodes and/or other patterned conductive structures.

For mass fabrication of a plastic display, such as an electrophoretic display, it may be advantageous to employ a continuous roll-to-roll process. However, the photolithographic approach described above is not well suited to such a roll-to-roll process, as certain of the processing steps, such as the image-wise exposure, are time consuming and require careful registration and alignment of the mask and the moving target area. In addition, development and stripping of photoresist and treatment of waste from the chemical etching process may be time consuming and expensive, in addition to potentially posing an environmental hazard.

Therefore, there is a need for a process for forming patterned conductive structures on a plastic substrate, for use in a plastic display such as an electrophoretic display, that does not require the use of photolithography or chemical etching and that is suitable for use in a continuous roll-to-roll process.

BRIEF DESCRIPTION OF THE DRAWINGS

The present invention will be readily understood by the following detailed description in conjunction with the accompanying drawings, wherein like reference numerals designate like structural elements, and in which:

FIGS. 5A-1 through 5D-2 illustrate an alternative process used in one embodiment to form a patterned thin film conductor on a substrate.

FIGS. 6A-1 through 6F-2 illustrate a further alternative to the process shown in FIGS. 1-4.

DETAILED DESCRIPTION

A detailed description of a preferred embodiment of the invention is provided below. While the invention is described in conjunction with that preferred embodiment, it should be understood that the invention is not limited to any one embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

A process for forming a patterned thin film structure on a substrate is disclosed. A pattern is printed with a material, such as a masking coating or an ink, on the substrate, the pattern being such that, in one embodiment, the desired thin film structures will be formed in the areas where the printed material is not present, i.e., a negative image of the thin film structure to be formed is printed. In another embodiment, the pattern is printed with a material that is difficult to strip from the substrate, and the desired thin film structures will be formed in the areas where the printed material is present, i.e., a positive image of the thin film structure is printed. The thin film material is deposited on the patterned substrate, and the undesired area is stripped, leaving behind the patterned electrode structures.

Figure 1:
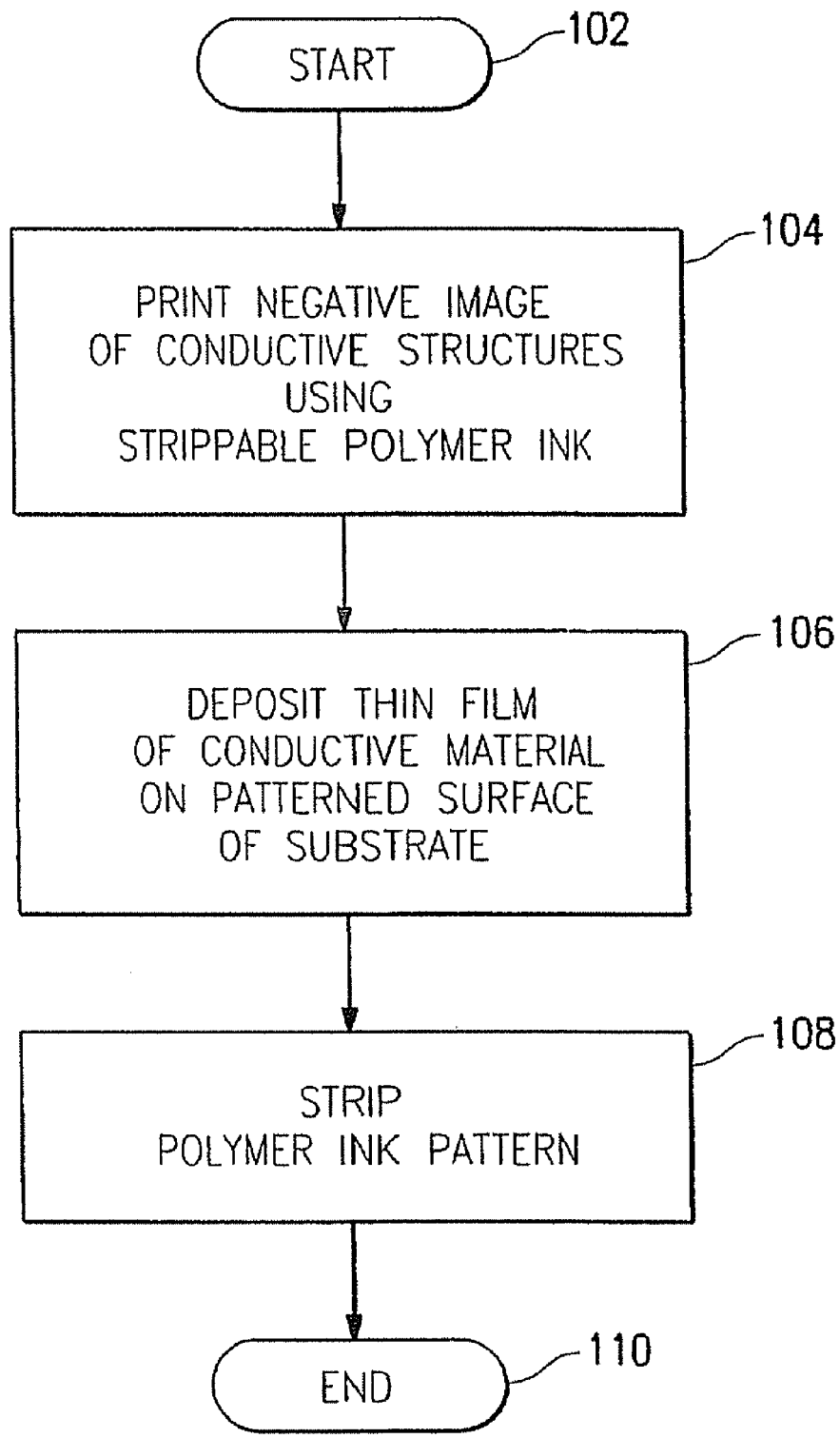
FIG. 1 is a flowchart illustrating a process used in one embodiment to form a patterned thin film conductor on a substrate.

FIG. 1 is a flowchart illustrating a process used in one embodiment to form a patterned thin film conductor on a substrate. The process begins in step 102 and proceeds to step 104 in which a negative image of the thin film structures to be formed is printed on the surface of the substrate using a masking coating or ink. In one embodiment, the masking coating or ink may be stripped using an aqueous solution and/or another common solvent. In step 104, a negative image of the thin film structures to be formed is printed in the sense that the masking coating or ink will cover areas of the substrate where the thin film material will not be present upon completion of the process and will not cover areas of the substrate where the thin film material will be present. In essence, the ink pattern serves as a mask for the subsequent deposition of thin film material, as described more fully below in connection with step 106.

Any suitable printing techniques, such as flexographic, driographic, electrophotographic, and lithographic printing, may be used to print the ink pattern on the substrate. In certain applications, other printing techniques, such as stamping, screen printing, gravure printing, ink jet, and thermal printing may be suitable, depending on the resolution required. In addition, the masking coating or ink does not need to be optically contrasted with the substrate, and can be colorless.

In one embodiment, the masking coating or ink comprises a re-dispersible particulate. In one embodiment, the masking coating or ink comprises 5-80% by weight, preferably 10-60% by weight based on dried weight of the masking ink/coating, of a re-dispersible particulate. In one embodiment, the masking coating or ink comprises a water-soluble or water-dispersible polymer as a binder. Typical examples of water soluble polymers include, but are not limited to, polyvinyl alcohol, polyvinylpyrrolidone, polyvinylpyridine, polyacrylic acid, polymethacrylic acid, polyacrylamide, polyethyleneglycol, poly(ethylene-co-maleic anhydride), poly (vinylether-co-maleic anhydride), poly(styrene-co-maleic anhydride), poly(butylene-co-itaconic acid), PEOX, polystyrene sulfonate, cellulose derivatives such as hydroxyethyl cellulose, hydroxypropyl cellulose, methyl cellulose, carboxymethyl cellulose, xanthan gum, gum Arabic, gelatin, lecithin, and their copolymers. In one such embodiment, the water-dispersible polymer comprises a water- or alkaline-dispersible wax, polyolefin, or acrylic latexes or dispersions.

In one embodiment, the masking coating or ink comprises a solvent-soluble or solvent-dispersible polymer as a binder. In one embodiment, the masking coating or ink comprises a re-dispersible particulate derived from silica, $CaCO_3$, $CaSO_4$, $BaSO_4$, $Al_2O_3$, $TiO_2$, hollow-spheres, non-film-forming latexes or dispersions, inorganic pigment(s), or organic pigment(s). In one embodiment, the masking coating or ink comprises a re-dispersible particulate comprising a polymeric or polymeric composite particle. In one embodiment, including a re-dispersible particulate in the masking coating or ink facilitates subsequent stripping of the masking coating or ink. In one embodiment, including a re-dispersible particulate in the masking coating or ink facilitates subsequent stripping of the masking coating or ink by reducing the thickness or integrity of the masking coating or ink layer and/or improving the permeation of a stripping solvent into the masking coating or ink layer during stripping.

In step 106, a thin film of material is deposited on the patterned surface of the substrate. In one embodiment, the thin film material may be conductive, non-conductive, or semi-conductive. In one embodiment, vapor deposition is used to deposit a thin film of conductive material on the patterned side of the substrate in step 106. In such an embodiment, aluminum, copper, or any conductive material suitable for being deposited as a thin film through vapor deposition or spraying may be used as the conductive material. In one alternative embodiment, the conductive material is deposited by sputter coating the patterned side of the substrate with the conductive material. In such an embodiment, indium tin oxide (ITO) or any other conductive material such as gold, silver, copper, iron, nickel, zinc, indium, chromium, aluminum-doped zinc oxide, gadolinium indium oxide, tin oxide, or fluorine-doped indium oxide, or any other conductive material suitable for being deposited in a thin film through sputter coating may be used.

In step 108 of the process shown in FIG. 1, the masking coating or ink is stripped from the patterned surface of the substrate on which the thin film material has been deposited in step 106. The stripping of the coating/ink in step 108 has the effect of stripping away the printed pattern formed in step 104 as well as the portion of the thin film material deposited in step 106 that was deposited on to the areas of the substrate where the coating/ink was present. As a result, the stripping solvent is able to strip away the coating/ink pattern and the thin film material formed on the top surface of the coating/ink pattern, even though the stripping step is performed after the deposition of the thin film in step 106. The process shown in FIG. 1 then ends in step 110. Without limiting the generality of the present disclosure, it is believed that in certain embodiments at least part of the masking coating/ink printed in step 104 is exposed, or nearly so, to the stripping solvent, despite the masking patterns having been covered with thin film material as a result of the deposition process of step 106. In one embodiment, the masking coating or ink comprises 5-80% by weight, preferably 10-60% by weight based on dried weight of the masking layer, of a re-dispersible particulate and a binder soluble or dispersible in the stripper composition.

The masking coating must meet certain conditions in order to be commercially useful. Because the masking coating is used in a manufacturing process which is usually carried out roll-to-roll, the masking coating needs to be rolled up in the process. To accommodate this manufacturing condition, the masking coating has to be non-blocking (i.e., layers do not stick together). Secondly, the stripping speed of the masking coating is critical to the production yield. However, these two conditions are difficult to meet at the same time.

Because most of the commonly used stripping solutions are water-based, the masking coating is usually formed of a water soluble polymer material. Polymeric materials of a high molecular weight, however, are often slow in dissolution. In order to speed up stripping, certain solubility enhancers of a low molecular weight have to be added. Alternatively, lower molecular weight polymers with a higher solubility may be used. These low molecular weight materials, however, often cause the film blocking phenomenon. While the blocking problem may be alleviated by incorporating particulate materials, the presence of inorganic particles, however, usually reduces film solubility, thus reducing the stripping speed.

It has now been found that when certain types of re-dispersible particulate materials are incorporated into a masking coating, both conditions described may be satisfied at the same time, without using a solubility enhancer. The term "re-dispersible particulate" is derived from the observation that the presence of these particles in a significant quantity will not decrease the stripping ability of a dried masking coating and, on the contrary, their presence actually enhances the stripping speed of the dried masking coating.

The re-dispersible particulate is particles that are surface treated to be hydrophilic through anionic, cationic, or non-ionic functionalities. Their sizes are in microns, preferably in the range of about 0.1 to about 15 um and more preferably in the range of about 0.3 to about 8 um. Particles in these size ranges have been found to create proper surface roughness on a masking coating having a thickness of <15 um. The re-dispersible particulate may have a surface area in the range of about 50 to about 500 $m^2/g$, preferably in the range of about 200 to about 400 $m^2/g$. The interior of the re-dispersible particulate may also be modified to have a pore volume in the range of about 0.3 to about 3.0 ml/g, preferably in the range of about 0.7 to about 2.0 ml/g.

Suitable re-dispersible particulate for the present invention may include, but are not limited to, micronized silica particles, such as those of the Sylojet series or Syloid series from Grace Davison, Columbia, Md., USA.

Non-porous nano sized water re-dispersible colloid silica particles, such as LUDOX AM can also be used together with the micron sized particles to enhance both the surface hardness and stripping rate of the masking layer.

Other organic and inorganic particles, with sufficient hydrophilicity through surface treatment, may also be suitable. The surface modification can be achieved by inorganic and organic surface modification. The surface treatment provides the dispersibility of the particles in water and the re-wet ability in the masking coating.

The presence of the re-dispersible particulates as described dramatically improves the stripability of the thin film on the masking coating as well as the blocking resistance of the masking coated films, particularly at high temperature and humidity conditions.

In one embodiment, low molecular weight additives such as plasticizers, surfactants, and residual monomers or solvents in the masking coating/ink may cause defects or microporosity in the thin film coated on the ink, accelerating exposure of the masking coating to the solvent. The present disclosure contemplates that any suitable combination of coating/ink, thin film, and stripping process may be used, without limiting the applicability of the present disclosure in any way, and without limiting the present disclosure to any particular stripping mechanism or theory. With respect to the process shown in FIG. 1, in an embodiment in which a conductive thin film structure, such as an electrode or conductive trace, is being formed, the only requirement is that the combination used be such that, upon stripping, the areas of thin film formed on the substrate remain present and the areas of thin film formed on the strippable masking coating/ink be stripped away, or largely so, such that the areas where the coating/ink pattern was present are not conductive, or sufficiently nearly so for the display to operate properly.

The process described above does not require the use of photolithography and selective etching of the thin film layer to define patterned thin film structures on a substrate. Instead, the ink pattern is used to define, prior to the deposition of the thin film material, the shape of the thin film structures to be formed. Because a simple solvent, such as water, aqueous solutions, alcohols, ketones, esters, amides, hydrocarbons, alkylbenzenes, pyrrolidones, sulfones, DMSO, or many other common organic solvents or solvent mixture, may be used to strip away the ink and the thin film material formed on top of the ink pattern, the patterned thin film structures may be formed via a roll-to-roll process that is not as time consuming, not as expensive, and does not generate as much toxic chemical waste as the photolithographic and chemical etching techniques used in prior art photolithographic processes.

Figure 2A:
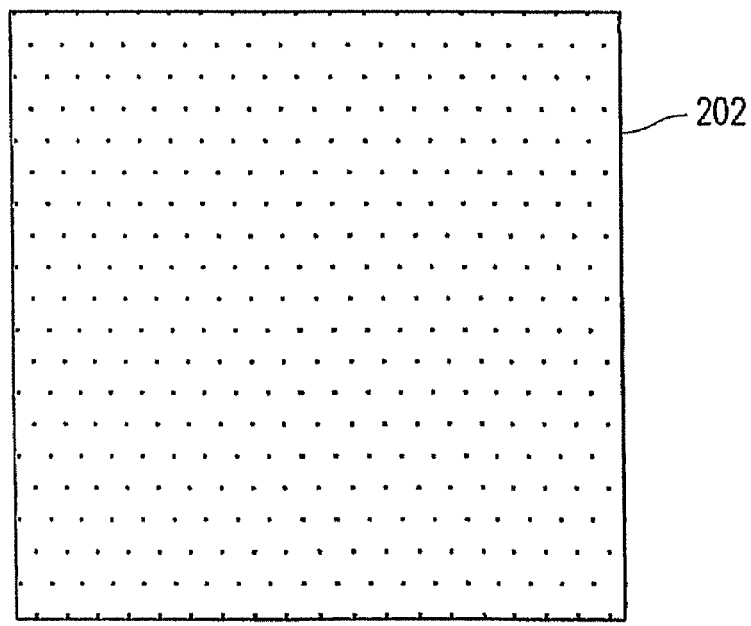
FIGS. 2A through 2D illustrate a schematic plan view of a series of processing steps used to form four column electrodes on a substrate.
Figure 2B:
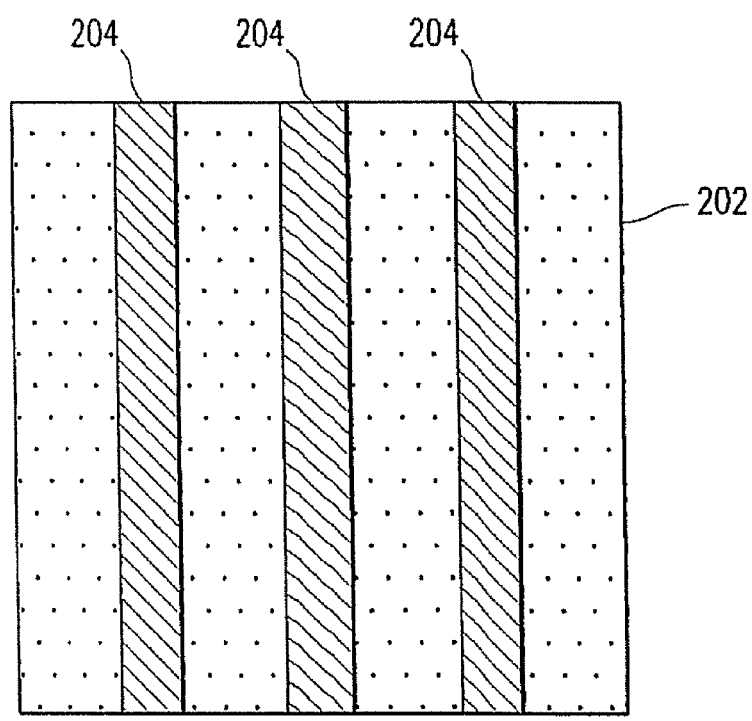

As noted above, one type of display that the above-described process may be used in connection with is a passive matrix display, such as a passive matrix electrophoretic display. A passive matrix display may, for example, comprise a patterned electrode layer comprising a plurality of column or row electrodes. FIGS. 2A through 2D illustrate a schematic plan view of a series of processing steps used to form four column electrodes on a substrate. FIG. 2A shows a plastic substrate 202. In FIG. 2B an ink pattern comprising lines 204 has been printed on the substrate 202. In the example shown in FIG. 2B the lines 204 define on the substrate 202 areas on which four column electrodes will be formed, as described more fully below, in the areas of substrate 202 that are not covered by the lines 204.

Figure 2C:
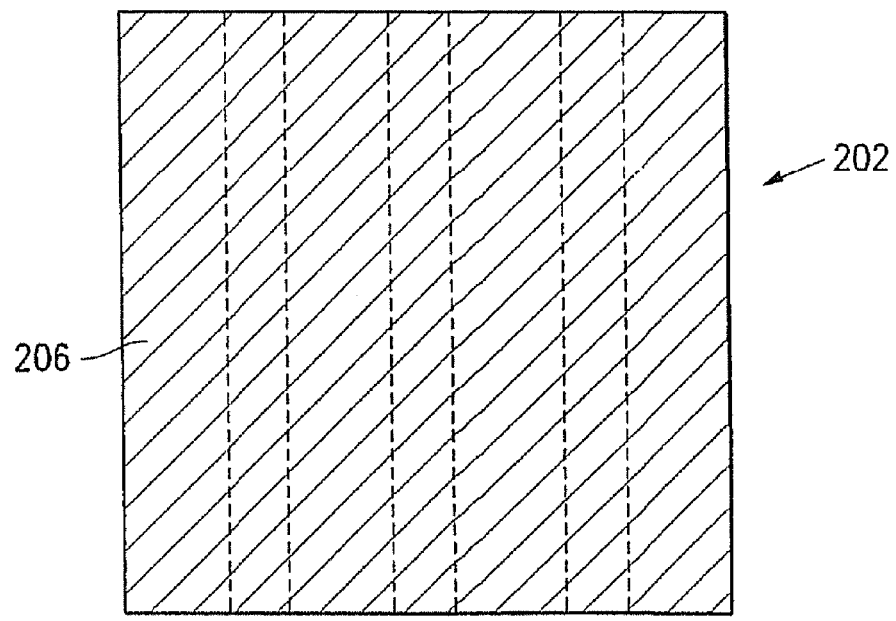
Figure 2D:
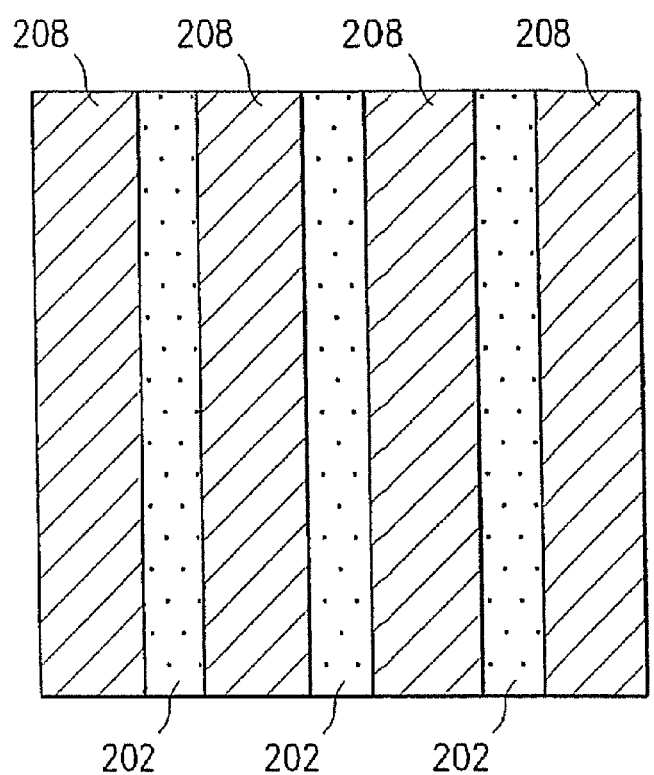

In FIG. 2C, a thin film layer 206 has been formed on the patterned surface of the substrate, covering both the portions of the substrate 202 that are not covered by the ink lines 204 (shown by dashed lines in FIG. 2C) and the portions that are covered by the ink lines 204. In FIG. 2D, the ink pattern has been stripped away, along with the portions of the thin film 206 that were deposited on the ink lines 204, exposing column electrodes 208. The respective column electrodes 208 are separated from each other by the areas of the substrate 202 exposed by the stripping away of the ink lines 204.

Figure 3A:
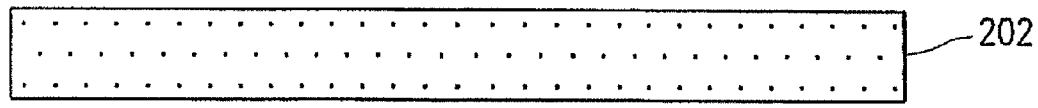
FIGS. 3A through 3D further illustrate the example shown in FIGS. 2A through 2D by providing a schematic front cross-sectional view of the processing steps shown in FIGS. 2A through 2D.
Figure 3B:
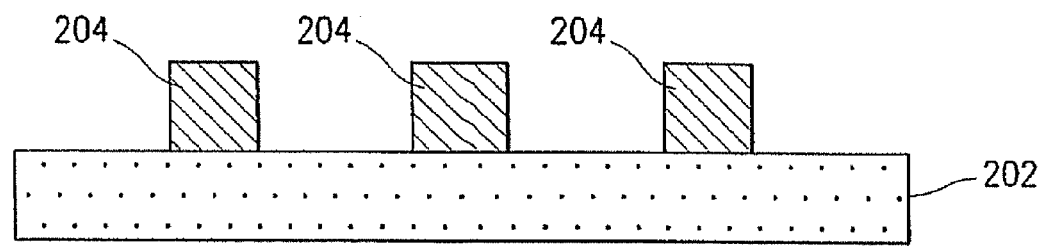
Figure 3C:
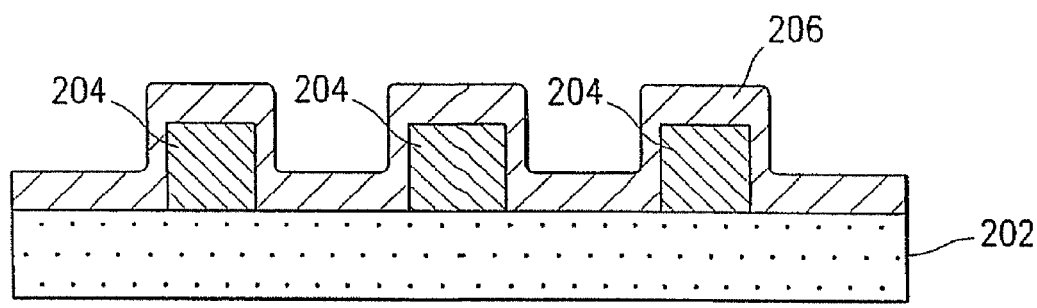
Figure 3D:
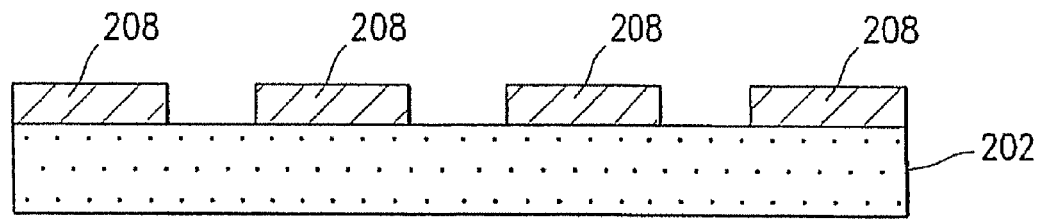

FIGS. 3A through 3D further illustrate the example shown in FIGS. 2A through 2D by providing a schematic front cross-sectional view of the processing steps shown in FIGS. 2A through 2D. FIG. 3A shows a front cross-sectional view of the substrate 202. FIG. 3B shows the ink lines 204 formed on the substrate 202. As shown in FIG. 3C, the thin film layer 206 forms on the portions of the substrate not covered by the lines 204 and on the top and side surfaces of the polymer ink lines 204. Finally, FIG. 3D shows the column electrodes 208 that remain formed on the substrate 202 subsequent to the stripping of the lines 204, which has the effect of stripping away both the ink lines 204 and any thin film material 206 formed on top of the ink lines 204.

Figure 4A:
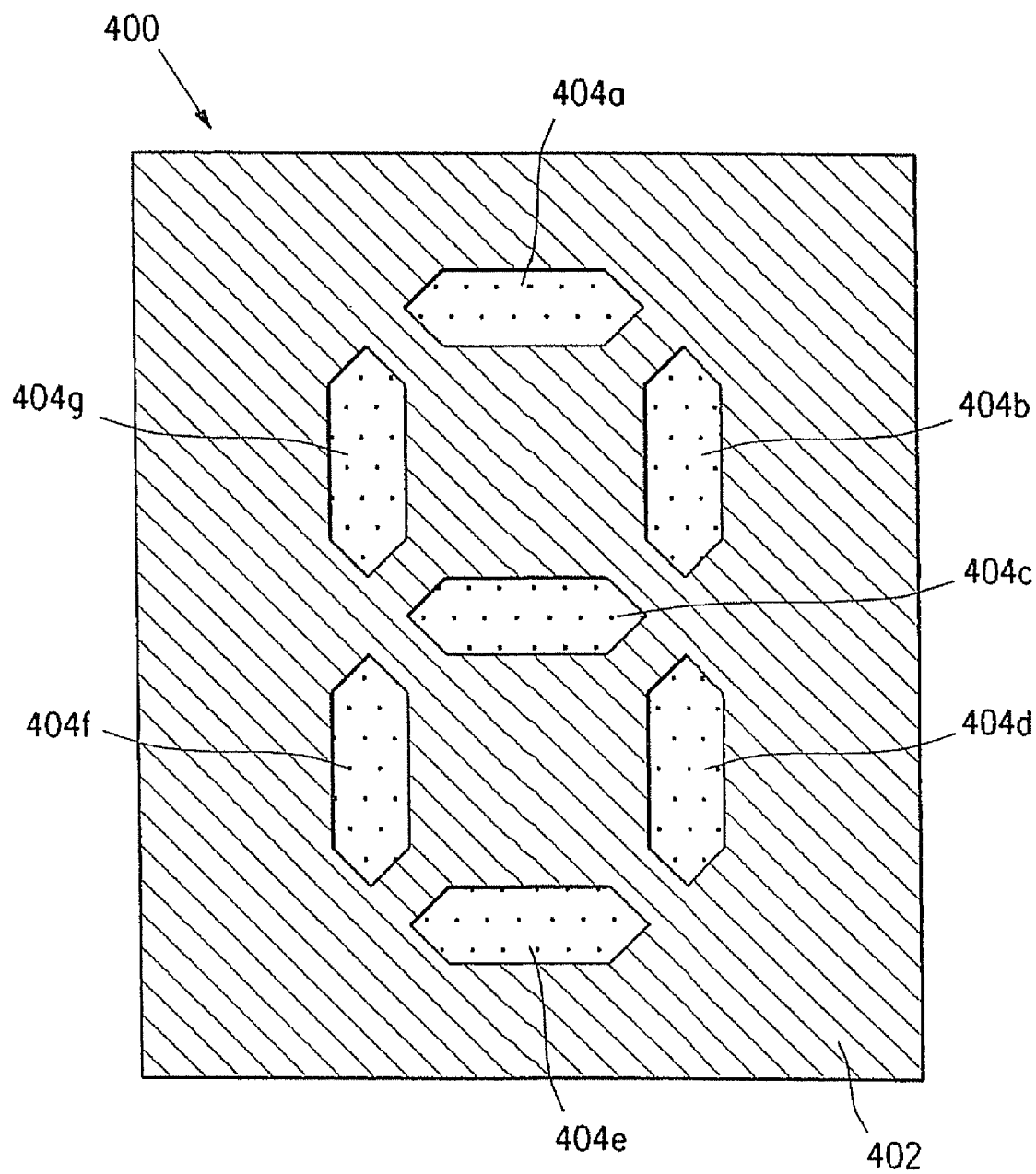
FIGS. 4A and 4B illustrate a schematic plan view of an example in which segment electrodes for a seven segment display are formed using an embodiment of the process described herein.
Figure 4B:
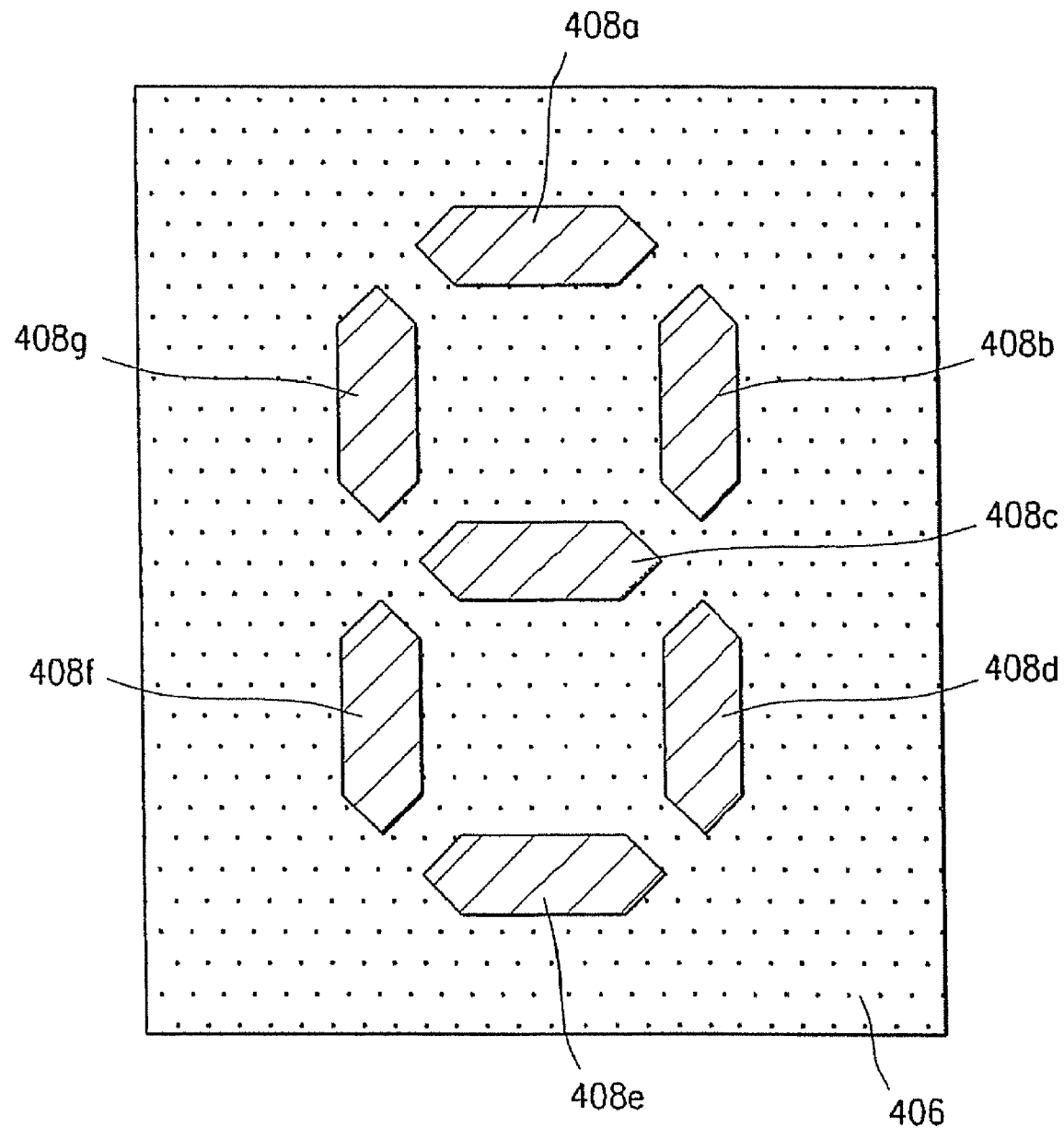

While FIGS. 2A-2D and 3A-3D illustrate an example in which four column electrodes are formed on a plastic substrate, the coating/ink may be printed in any pattern to define on the substrate thin film structures of any desired shape or size. FIGS. 4A and 4B illustrate a schematic plan view of an example in which segment electrodes for a seven segment display are formed using an embodiment of the process described herein. FIG. 4A shows display electrode layer 400 comprising a polymer ink pattern 402 defining on a plastic substrate seven segment electrode areas 404*a*-404*g* in which the ink pattern 402 is not present such that the underlying substrate is exposed. FIG. 4B shows the same display electrode layer 400 subsequent to the steps of deposition of the thin film and stripping of the ink pattern. As shown in FIG. 4B, the stripping away of the ink exposes a background area 406 of the substrate on which no thin film structure is present. In addition, segment electrodes 408a-408g have been formed and remain in the segment electrode areas 404A-404G defined as described above in connection with FIG. 4A.

As is apparent from the above discussion, thin film structures of any shape or size may be formed simply by defining through use of the printed pattern areas on the substrate on which thin film structures are to be formed. The structures may include electrode structures such as those described above and/or conductive traces or any other thin film structure desired.

The processes described herein may be used in one embodiment to form a top or bottom electrode layer to be disposed adjacent to an electrophoretic display media layer. In one embodiment, the electrophoretic display media comprises a layer of sealed microcups, each comprising a quantity of electrophoretic dispersion. In one embodiment, a protective overcoat such as an antiglare protective coating comprising particulate filler may be applied onto the sealed microcups or the top (viewing side) electrode layer to further improve the optical or physicomechanical properties of the finished panel.

In one embodiment, conductive thin film structures are formed on both the top and bottom surfaces of the substrate, using the process described herein first to form thin film structures on one side of the substrate and then to form thin film structures on the opposite side of the substrate using the same series of steps described above for forming thin film structures on one side of the substrate. In one embodiment, conductive thin film structures on the top surface of the substrate may be connected electrically to conductive surfaces formed on the bottom surface of the substrate by forming via holes and completing an electrical connection through the via hole from a conductive structure on the top surface of the substrate to a conductive structure on the bottom surface of the substrate, as described in U.S. patent application Ser. No. 10/422,413, which is incorporated herein by reference.

In one embodiment of the process illustrated in FIGS. 1-4, the coating/ink used to pattern the substrate comprises Sun Chemical Aquabond AP blue ink and/or Sunester red ink (Sun Chemical, Northlake, Ill.) and the substrate comprises 5 mil thick Melinex 453 polyester (DuPont Teijin, Hopewell, Va.). The ink may be applied through a stencil using a hand proofer with a #360 anilox roller. The ink may be dried with a heat gun. The thin film material is deposited by loading the patterned substrate into a DC-magnetron sputtering system to deposit ITO film up to about 100 nm thickness. The patterned substrate may be plasma treated prior to deposition of the thin film. The ink pattern and thin film formed thereon is stripped by spraying the patterned substrate on which the thin film has been formed with acetone (Histological grade, Fisher Scientific) for 1 to 2 minutes at room temperature. The above processing steps result in the thin film (i.e., ITO) formed in the ink pattern being removed along with the ink, leaving an area on the substrate where no ITO coating is present such that no measurable conductivity in present in such areas where the ITO has been removed.

In one embodiment of the processes illustrated in FIGS. 1-4, Film III Warm Red ink (Environmental Inks and Coatings, Los Angeles, Calif.) is applied using a hand proofer to define a pattern or mask on a substrate comprising 5 mil thick Melinex ST505 polyester (DuPont Teijin, Hopewell, Va.). The thin film is deposited by loading the patterned substrate into a DC-magnetron sputtering system to deposit ITO film up to about 100 nm thickness. The ink is washed from the ITO coated patterned substrate by spraying with acetone (Histological grade, Fisher Scientific) for 30 to 60 sec. The ITO formed on the ink is removed along with the ink, leaving an area where there is no ITO coating where the ink pattern was printed.

In one embodiment of the processes illustrated in FIGS. 1-4, the ink pattern is printed on 5 mil thick, 4507 Polyester (Transilwrap, Franklin Park, Ill.) using GP-217 Process Magenta ink (Ink Systems Inc., Commerce, Calif.) on an offset press. The inked polyester is loaded in a vacuum system for aluminum evaporation at the film thickness of 120 nm. The aluminum coated polyester is immersed in hot (T=about 80° C.) methyl ethyl ketone (Certified grade, Fisher Scientific, MEK) for 15 seconds, and then wiped gently with a cotton swab soaked in MEK. This process strips the inked area from the polyester, along with the aluminum on top of the ink. The stripping results in a negative image from the ink, i.e., there is no aluminum coating in the areas where the ink pattern was printed, with the remaining areas (i.e., where the ink pattern was not present) being coated with aluminum.

In one embodiment of the processes illustrated in FIGS. 1-4, an ink pattern is made on a roll of 5 mil thick, 12" wide Melinex 453 polyester (Plastics Suppliers, Fullerton Calif.) using Film III Warm Red ink (Environmental Inks and Coatings, Los Angeles, Calif.) on a Mark Andy 4200 flexographic press. The patterned polyester is loaded into a DC-magnetron sputtering system to deposit ITO film for about 100 nm. Prior to the deposition, the ink coated sheets may be plasma treated. The ITO coated polyester is then immersed in a jar of hot (T=about 80° C.) MEK and cleaned ultrasonically using a Fisher Scientific FS220H ultrasonic cleaner for 2 minutes. As a result of the ultrasonic cleaning step, the ink is stripped from the polyester, along with the ITO formed on top of the ink.

In one embodiment in which conductive structures are formed on both the top and bottom surfaces of the substrate, the processes illustrated in FIGS. 1-4 may comprise printing on both sides of a roll of Melinex 561 polyester (10" wide, 4 mil thick, DuPont Teijin Films, Wilmington, Del.) using Film III Warm Red Ink (Environmental Inks and Coatings, Morganton, N.C.) on a Mark Andy 4200 flexographic press. In one embodiment, the first side is printed with a first pattern A at one printing station, the web is run through a turn bar that flips the web, and the other side of the substrate is aligned and printed with a second pattern B at the next plate station during the same printing run. In one embodiment, the first pattern A comprises a negative image defining ink free areas in which segment electrodes are to be formed, and the second pattern B comprises a negative image defining ink free areas in which conductive lines are to be formed. The patterns are aligned such that each ink free segment electrode area in pattern A is aligned with the end of one ink free conductive line in pattern B, such as may be desirable to allow for an electrical connection to be made between a segment electrode of side A and a conductive line of side B through a conductive via structure through the substrate. In one embodiment, about 40' of the polyester printed on both sides is sputtered on both sides with 2500 angstroms of aluminum. A 5"×5" piece of the aluminum coated polyester is developed by immersing it in a crystallizing dish containing methyl ethyl ketone, and putting the dish into a Fisher #FS220H ultrasonicator (Fisher Scientific, Pittsburgh, Pa.) filled an inch deep with water for 2 minutes. This yields a polyester electrode with one side having aluminum only in the segment pattern of the ink free areas of A, and the opposite side having the electrode pattern of the ink free lines in B.

The ability to strip away the masking coating/ink lines after deposition of the thin film using a simple stripping process that is not destructive of the thin film formed in the areas where the coating/ink pattern is not present (such as but not limited to the solvent and physical peeling processes described above) facilitates a continuous fabrication process, such as a roll to roll fabrication process, because no time consuming batch processes such as image-wise exposure and development of photoresist, etching away portions of a thin film layer not covered by photoresist, or using solvents requiring special handling or conditions to remove a photoresist layer after etching, are required. By saving time and using less expensive materials, the process described herein is much less costly than other processes typically used to form on a polymer substrate the types of structures described herein.

FIGS. 5A-1 through 5D-2 illustrate an alternative process used in one embodiment to form a patterned thin film conductor on a substrate. The alternative process shown in FIGS. 5A-1 through 5D-2 employs a "positive" printed image in the sense that the coating/ink is printed in the pattern of the thin film structure(s) to be formed, instead of being used as described above in connection with FIGS. 1-4 to define areas where the thin film structure(s) is/are not to be formed. The process illustrated in FIGS. 5A-1 through 5D-2 is similar to that shown in FIGS. 1-4 in that the process shown in FIGS. 5A-1 through 5D-2 employs printing techniques to define the thin film structure(s) to be formed. The process shown in FIGS. 5A-1 through 5D-2 differs from the process shown in FIGS. 1-4, however, in that the printed pattern is not stripped off the substrate, as described more fully below.

Figures 1, 5A:
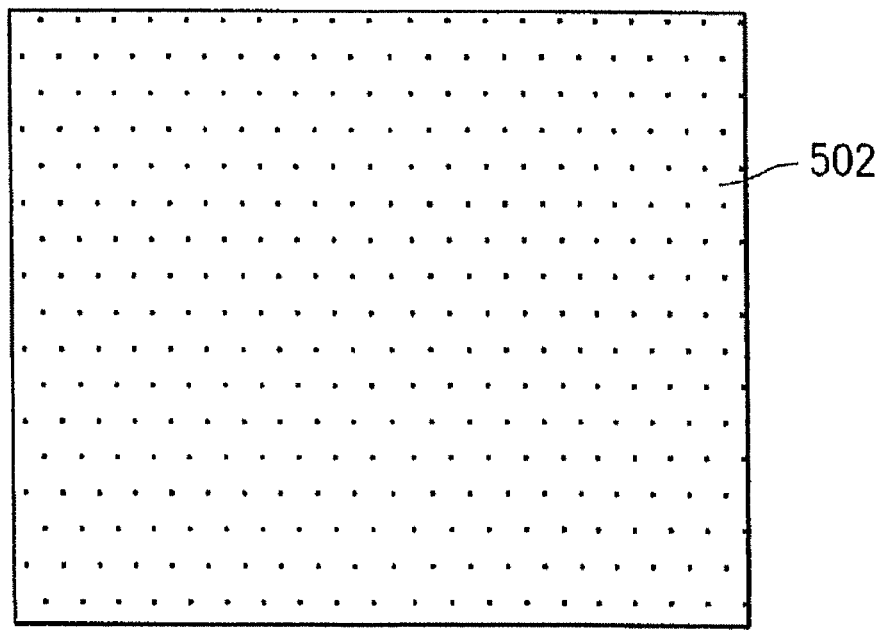
Figures 2, 5A:
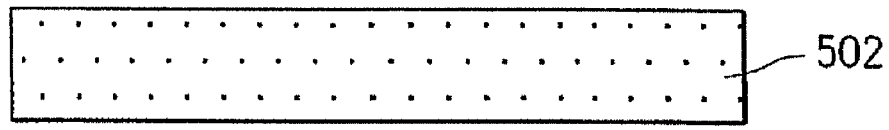
Figures 1, 5B:
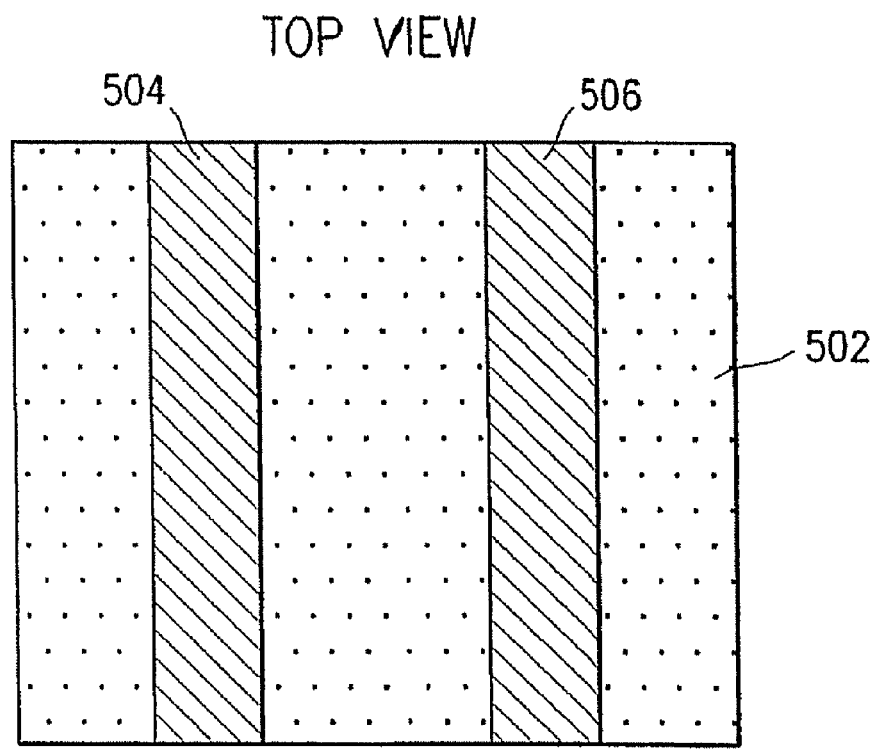
Figures 2, 5B:
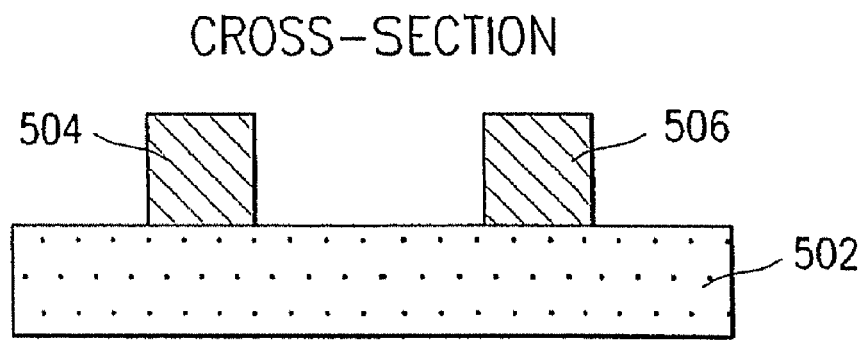

As shown in FIGS. 5A-1 and 5A-2, the thin film structures are formed on a substrate 502. The substrate 502 may be any of the substrate materials described above for use in the process illustrated by FIGS. 1-4. In one embodiment, the substrate comprises 5 mil thick, 4507 Polyester (available from Transilwrap, Franklin Park, Ill.). FIGS. 5B-1 and 5B-2 show pattern lines 504 and 506 printed on the substrate 502. In one embodiment, the pattern lines 504 and 506 are printed on the substrate 502 using GP20011 UV Process Magenta ink (Ink Systems Inc., Commerce, Calif.) on an offset press. Any ink or other printable material may be used that has the characteristic that the subsequently deposited thin film adheres to the printed material more strongly than it adheres to the substrate, as explained more fully below.

Figures 1, 5C:
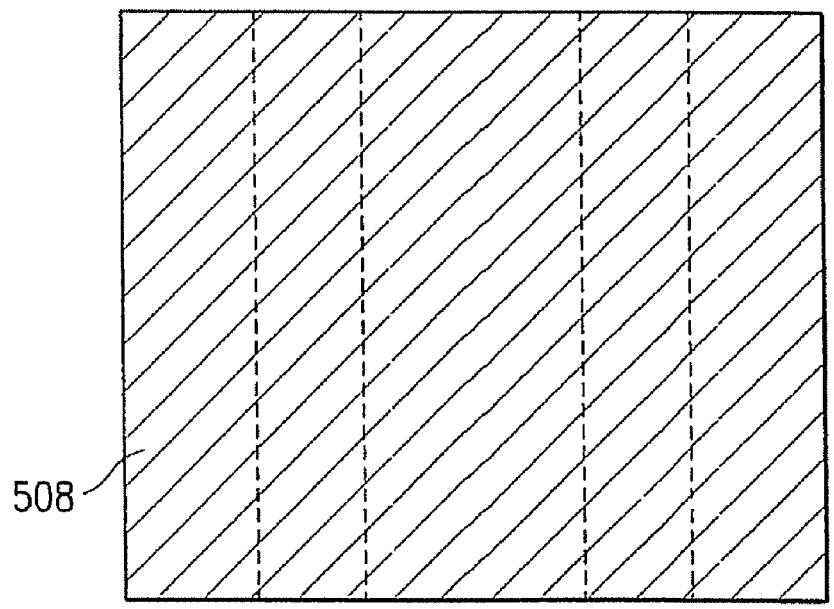
Figures 2, 5C:
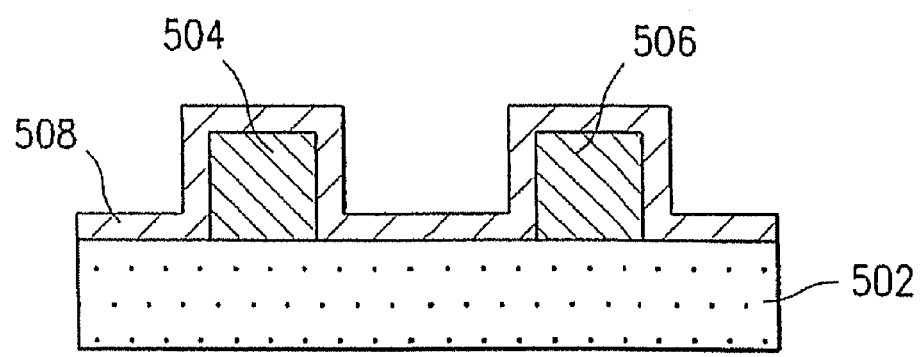

FIGS. 5C-1 and 5C-2 show a thin film layer 508 being formed on the patterned surface of the substrate, covering both the printed pattern (lines 504 and 506) and the areas of the substrate 502 not covered by the printed pattern. In one embodiment, the thin film 508 is formed by loading the patterned substrate into a vacuum system for aluminum evaporation at a film thickness of 120 nm.

Figures 1, 5D:
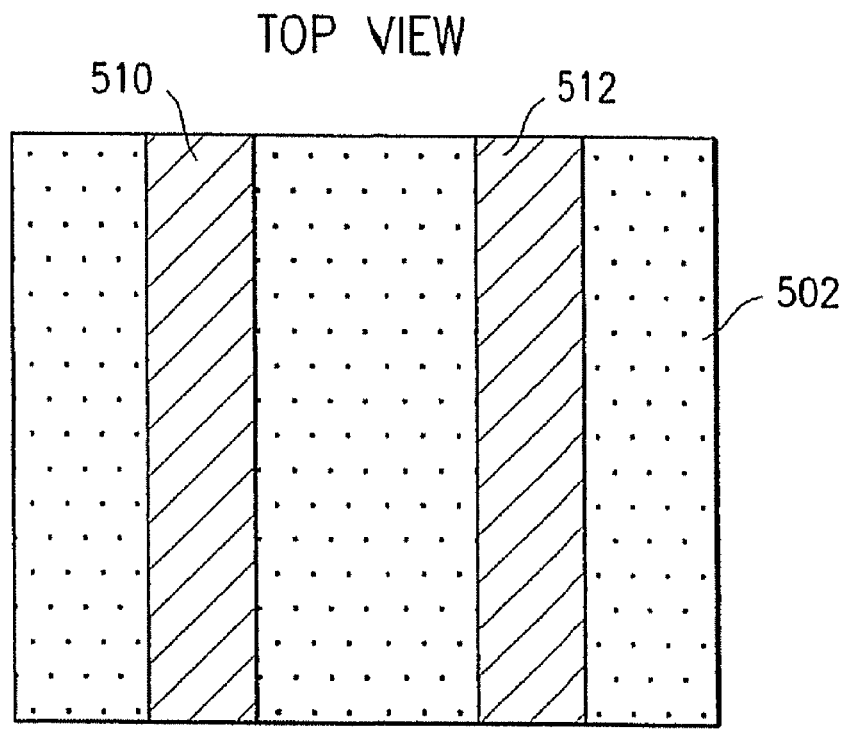
Figures 2, 5D:
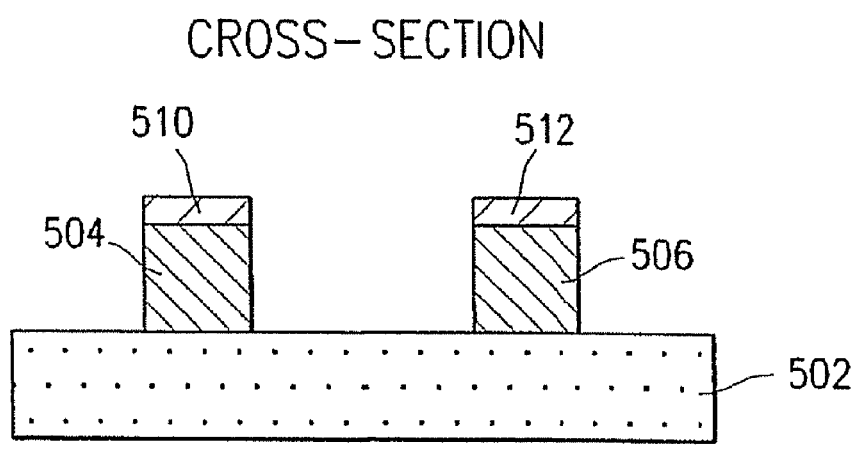

FIGS. 5D-1 and 5D-2 show the remaining structures after the portions of the thin film 508 formed on the substrate 502 have been removed by a stripping process. Thin film structures 510 and 512 remain formed on printed lines 504 and 506, respectively. In one embodiment, a solvent is used to remove the portions of the thin film formed directly on the substrate, but not the portions of the thin film formed over the printed material, leaving thin film structures in the same pattern as the printed material. In one embodiment, not shown in FIGS. 5D-1 and 5D-2, some or all of the thin film formed on the side surfaces of the printed material remains adhered to the side surfaces of the printed material after the stripping process. In one embodiment, not all of the thin film formed directly on the substrate is removed by the stripping process, but the thin film formed directly on the substrate is removed sufficiently to cause there to be no measurable conductivity in the areas of the substrate where the printed material was not printed.

The alternative process shown in FIGS. 5A-1 through 5D-2 requires that the adhesion of the thin film layer to the substrate be low, the adhesion of the thin film layer to the printed material be high, the adhesion of the printed material to the substrate be high, and that the solvent be such that it removes the portions of the thin film layer that are formed directly on the substrate but not those portions of the thin film layer formed on the printed material.

In another alternative process, a substrate having a poor affinity toward the thin film may be used. In one such embodiment, a surface treatment or primer coating such as a UV curable polymer layer, having good adhesion to both the substrate and the thin film is used to replace the masking coating/ink in steps 104 and 106 of the process shown in FIG. 1. In this case, the thin film on the uncoated areas will be removed in the stripping process to reveal the electrode pattern or trace on the top of the surface treatment or primer coating. This alternative process is similar to that shown in FIGS. 5A-1 through 5D-2, with the primer coating comprising the printed material, such as pattern lines 504 and 506.

Figures 1, 6A:
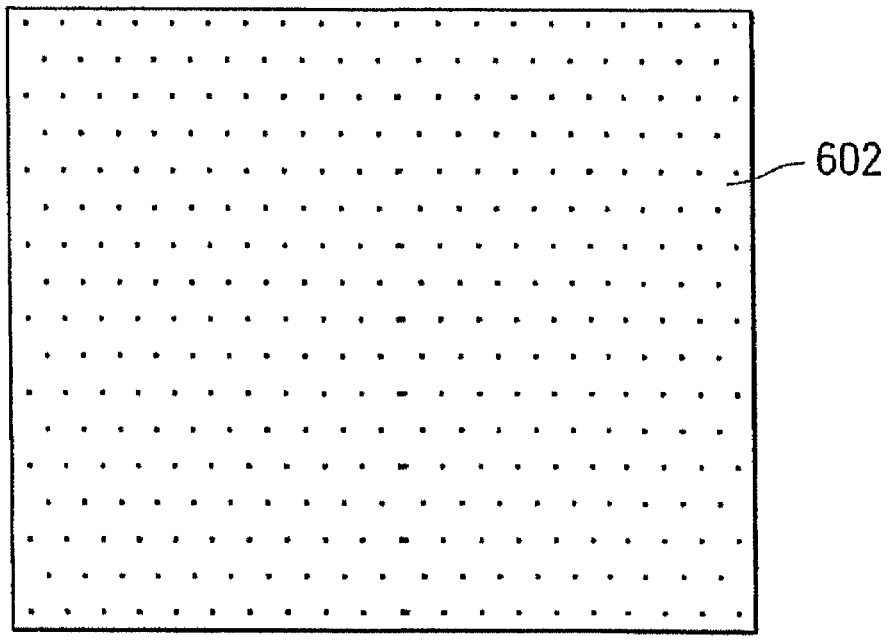
Figures 2, 6A:
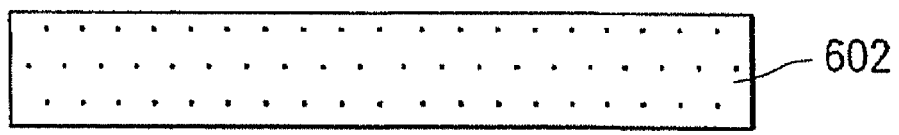
Figures 1, 6B:
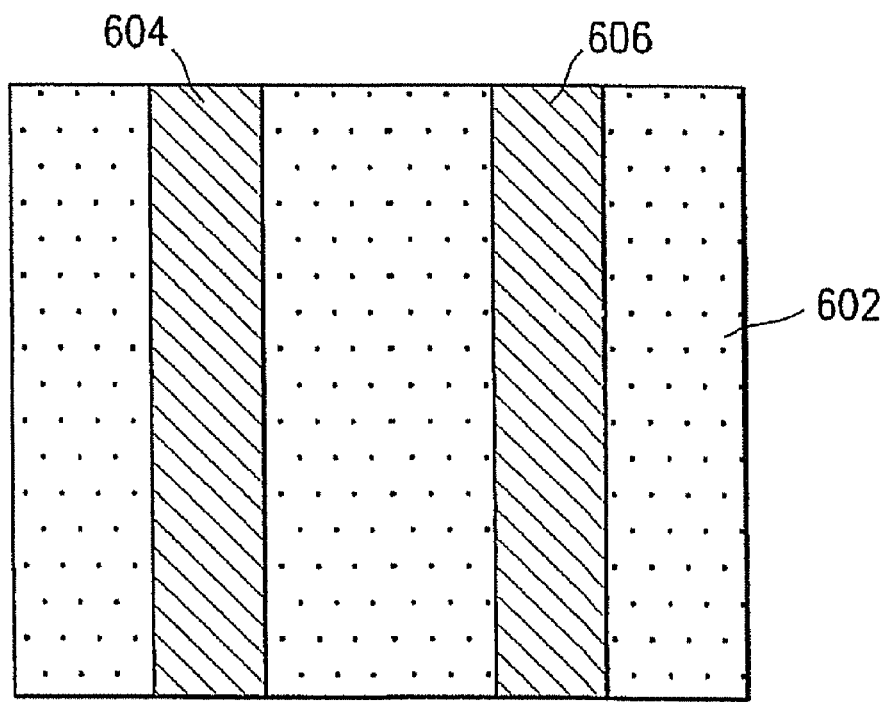
Figures 2, 6B:
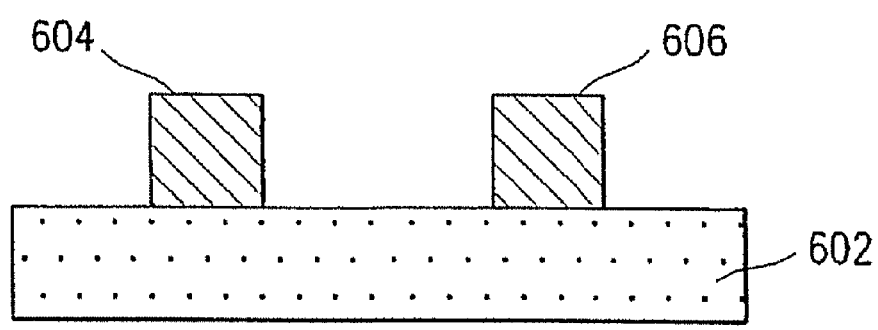
Figures 1, 6C:
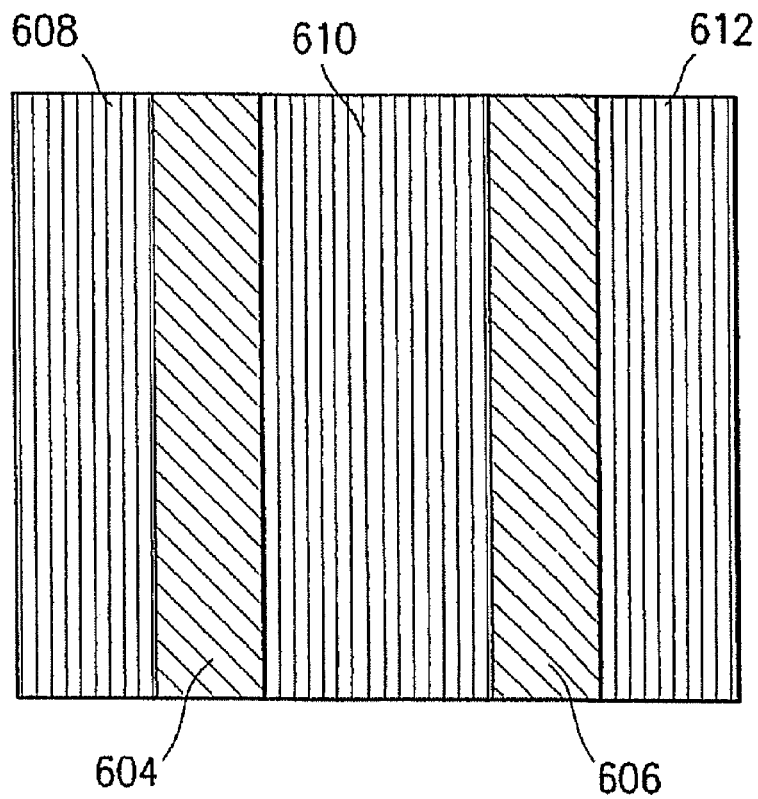
Figures 2, 6C:
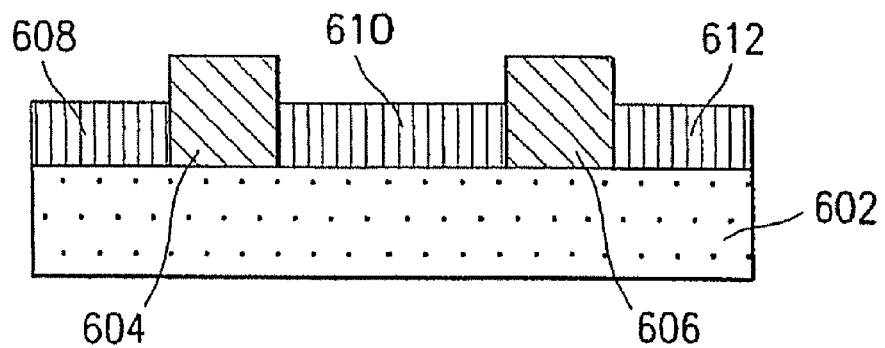
Figures 1, 6D:
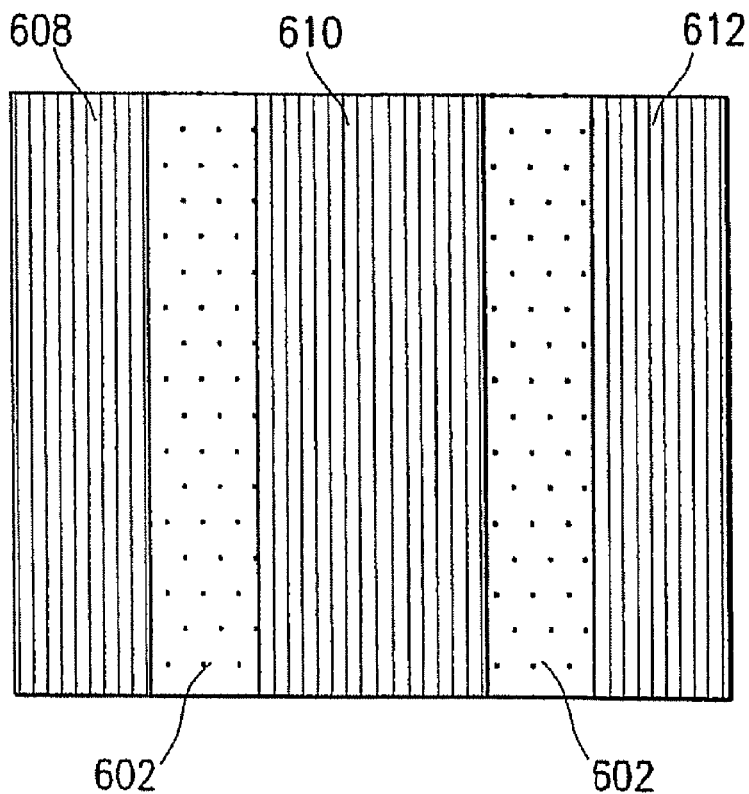
Figures 2, 6D:
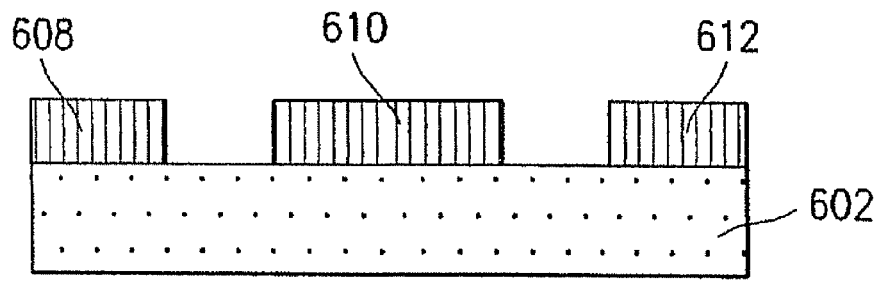
Figures 1, 6E:
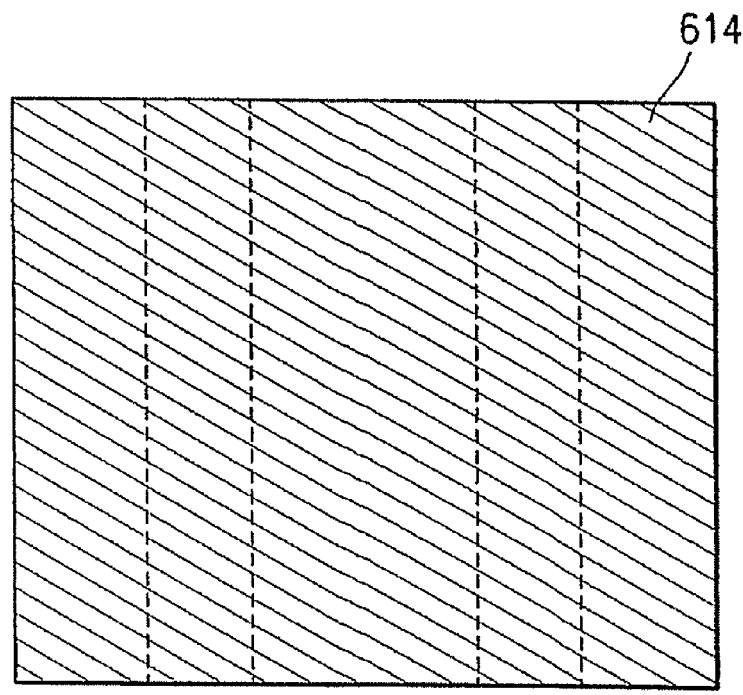
Figures 2, 6E:
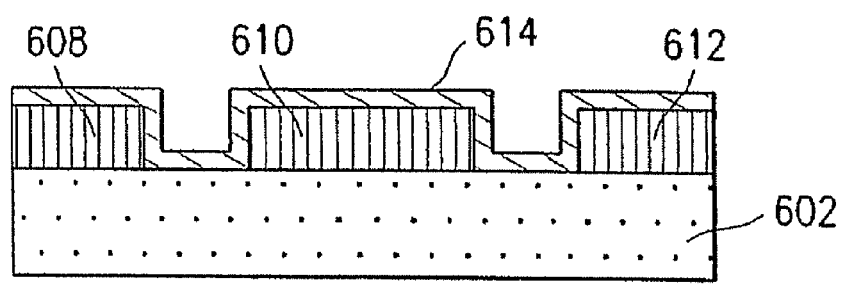
Figures 1, 6F:
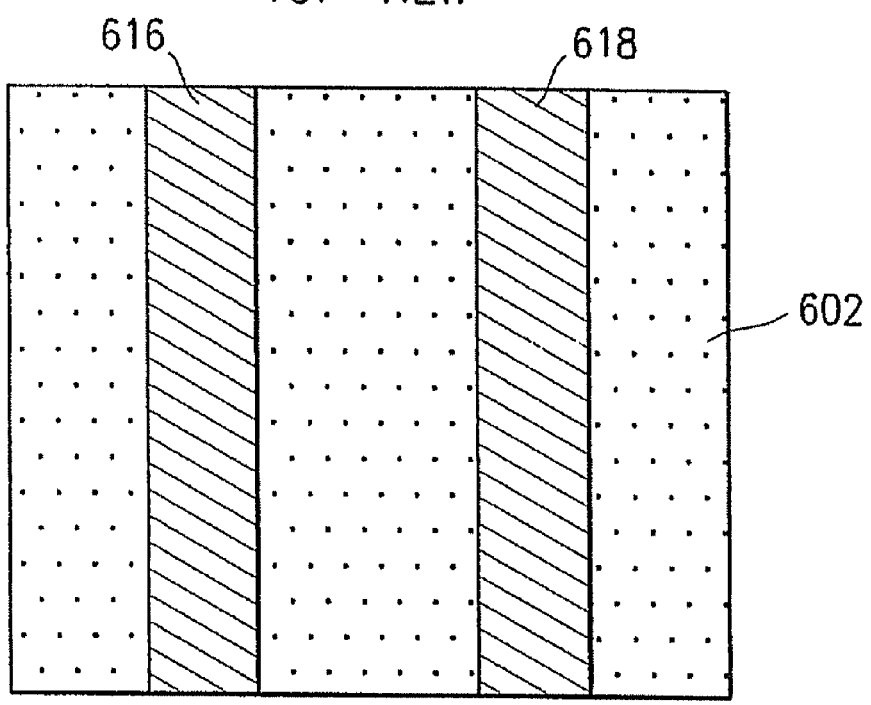
Figures 2, 6F:
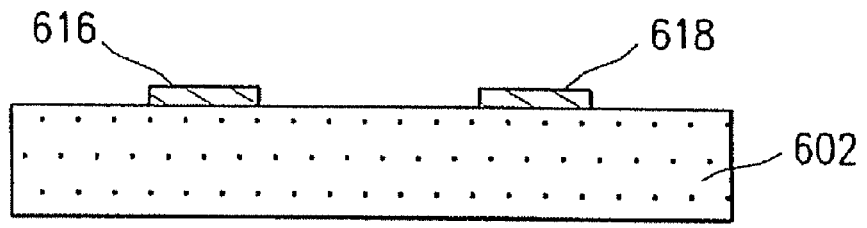

FIGS. 6A-1 through 6F-2 illustrate a further alternative to the process shown in FIGS. 1-4. FIGS. 6A-1 and 6A-2 show a substrate 602. In FIGS. 6B-1 and 6B-2, pattern lines 604 and 606 have been printed onto the substrate 602 using a printable first material. In one embodiment, as shown in FIGS. 6C-1 and 6C-2, the printed substrate is then over-coated with a second material that is not soluble in at least one solvent in which the first printable material is soluble, such that said at least one solvent could be used to strip the first printable material without also stripping the second material. In one embodiment, the printable first material is hydrophobic (i.e., water repelling) and solvent soluble and has a low surface tension. In one embodiment, the second material is water-based and is repelled by the first material, such that the overcoat adheres only to those portions of the substrate not covered by the first material, forming areas 608, 610, and 612 comprising the second (water-based) material. In one alternative embodiment, the second material is not repelled by the first material and the second material may partially or fully overcoat the pattern lines 604 and 606 shown in FIGS. 6C-1 and 6C-2. In one such embodiment, in the regions in which the second material overcoats the first material, the second material may be less thick than in regions in which the second material is applied directly to the substrate (i.e., regions on the substrate in which the first material is not printed). In one embodiment, the first material is stripped using a suitable solvent that does not also strip away the second material, leaving the structure shown in FIGS. 6D-1 and 6D-2, in which the structures 604 and 606 comprising the first material have been stripped away, leaving the structures 608, 610, and 612 comprising the second material on the substrate 602. In one embodiment in which the second material may partially or fully overcoat the printed first material, portions of the second material so formed on the first material are stripped away along with the portions of the first material on which they are formed, leaving the portions of the second material applied directly to the substrate (i.e., in regions where the first material was not present), as shown in FIGS. 6D-1 and 6D-2. In one embodiment, the solvent used to strip away the first printable material (and, if applicable, portions of the second material formed thereon) comprises an aqueous solution or water. In one embodiment, the solvent used to strip away the first printable material comprises a non-aqueous solvent or solution. Next, as shown in FIGS. 6E-1 and 6E-2, a thin film 614 is formed both on the structures 608, 610, and 612 and on the portions of the substrate 602 not covered by the second material, using one of the thin film materials described above. In one embodiment, the thin film is formed by sputtering, vapor deposition, spraying, or some other suitable technique. Finally, FIGS. 6F-1 and 6F-2 show the thin film structures 616 and 618 that remain after the second material has been stripped away with an appropriate solvent, or another appropriate chemical or mechanical stripping process. In one embodiment, the solvent used to strip away the first material is an aqueous basic solution and the solvent used to strip away the second material is an aqueous acidic solution, an aqueous neutral solution, or water. In one embodiment, the solvent used to strip away the first material is an aqueous acidic solution and the solvent used to strip away the second material is an aqueous basic solution, an aqueous neutral solution, or water. In one embodiment, the solvent used to strip away the first material is an aqueous neutral solution or water and the solvent used to strip away the second material is an aqueous acidic solution or an aqueous basic solution.

Under the process shown in FIGS. 6A-1 through 6F-2, the printed pattern of the first material comprises a positive image of the thin film structures to be formed. Once the first material has been stripped away, as described above, the remaining second material comprises a negative image of the thin film structures to be formed. In a sense, the first material may be considered a mask that may be used to define areas having very small dimensions, such as very fine lines, in which the thin film structures will not be present. While it may be difficult with practically useful printing techniques, such as flexographic, to print such narrow lines in the first instance, for example because of physical limitations, spreading of the ink after printing, etc., such techniques may be used readily to print less fine lines or less small areas with only small gaps separating the lines or areas. A second material such as described above may then be used to fill in the narrow spaces between the areas covered by the first material, which first material may then be stripped away using an appropriate solvent, leaving behind very fine lines or other shapes comprising the second material, which very fine lines or shapes it may not have been practical to print in the first instance. These lines may then be used, as described above, as a negative image for the formation of adjacent thin film structures separated by very narrow gaps, for example.

In one embodiment, a physical stripping process such as peeling is used to reveal the thin film structures. For example, an adhesive tape having an appropriate cohesion strength and adhesion strength to ITO is laminated onto an ITO/PET film pre-printed with a masking coating/ink. A subsequent peeling will remove the ITO either on the area printed with masking ink or on the area without the ink depending on the cohesion strength of the ink and the adhesion strengths at the ink-PET and ITO-PET interfaces. This stripping technique may be used with any of the processes described above.

In one embodiment, the process of FIGS. 6A-1 through 6F-2 comprises printing a positive image of desired thin film thin film structures on a roll of Melinex 582 polyester (4 mil thick, 14" wide, Dupont Teijin Films, Wilmington, Del.) using Film III Warm Red Ink (Environmental Inks and Coatings, Morganton, N.C.) on a Mark Andy 4200 flexographic press. The printed portion of the polyester roll is then coated with a solution consisting of 16 parts of aqueous 10% polyvinyl pyrrolidinone (PVP-90, ISP Technologies, Inc., Wayne, N.J.), 0.40 parts Sunsperse Violet (Sun Chemical, Cincinnati, Ohio), and 16 parts water using a #6 Meyer bar, and dried 1.5 minutes in an oven at 80° C. The film is then placed in a crystallizing dish containing ethyl acetate. A 10"×10"×12.5" ultrasonication bath (BLACKSTONE-NEY, PROT-0512H EP ultrasonic bath driven by a 12 T MultiSonik™ generator) is filled with about 4" of water and the dish containing the film is floated in the water and ultrasonicated at 104 KHz for 5 minutes. The film is then removed from the dish and dried 1.5 minutes in an oven at 80° C. At the completion of the drying step, the film has lines of PVP coating that define a negative image of the originally printed positive image. The patterned polyester is next sputter coated with ITO using a CHA Mark 50 roll coater to deposit a 1250 angstroms thick ITO film. The ITO coated patterned polyester is then ultrasonicated for 3 minutes in a beaker containing water placed in a Fisher #FS220H ultrasonicator (Fisher Scientific, Pittsburgh, Pa.). The film is then rinsed with de-ionized water and dried by blowing the water off with a stream of air. The resulting film has ITO structures in the shape of the originally printed positive image.

In one embodiment, the process shown in FIGS. 6A-1 through 6F-2 comprises sputter deposition of ITO film on a PET substrate having a hydrophilic coating, e.g., Melnix 582, and printed using warm red ink (Environmental Ink). In one embodiment, this combination of materials allows the ITO to be stripped from undesired areas ultrasonically using a water based stripper.

In one embodiment, the water based stripper for ITO stripping could be a surfactant solution such as JEM-126 (sodium tripolyphosphate, sodium silicate, nonyl phenol ethoxylate, ethylene glycol monobutyl ether and sodium hydroxide), detergent formulation 409, hydroperoxide, and developer Shipley 453, etc.

In one embodiment, the ITO stripping rate depends on the solvent concentration, solvent temperature, and the position of the substrate film relative to the ultrasound transducer.

In one embodiment, prior to the ITO sputter deposition, the ink printed PET surface is pre-treated with an appropriate plasma. In one embodiment, such plasma pretreatment minimizes the generation of micro-cracks on the patterned ITO structures during the ITO stripping process. In addition, such plasma pre-treatment may in one embodiment prevent ITO residue from being generated on the printed ink area as a result of removal of part of the printed ink pattern due to high-energy plasma, which may generate ITO residue on the printed ink area during the stripping process.

In order to eliminate the optical impact of minor ink residue appearing on the stripped ITO surface, in one embodiment a colorless ink printed on the PET surface is preferred.

The additional examples listed below (identified as Embodiments A through F to facilitate comparison) further illustrate the benefits, in terms of the patterning of thin film and the related manufacturing and handling processes, e.g., of including in the masking coating/ink a re-dispersible particulate as described herein, such as in the processes described above in connection with FIGS. 1 through 4B.

In an Embodiment A, the following masking layer composition was used for aluminum (Al) metal thin film patterning: 5.5 grams Celvol 203S (PVA from Celanese, Dallas, Tex., LMW, 87% hydrolysis), 5.5 grams PVP K-30 (from ISP Corp., Wayne, N.J.), and 0.1 grams of Xanthan Gum (from Allchem, Inc., Dalton, Ga.) were dissolved slowly at room temperature into 39.2 grams of de-ionized water. To the masking composition, 0.23 grams of Silwet L-7608 (from OSi Specialties, Middlebury, Conn.), was added. The resultant solution was used as the masking coating/ink for printing a pattern on a substrate for metallization, e.g., as described herein.

In an Embodiment B, the following masking layer composition was used for aluminum (Al) metal thin film patterning: 3.0 grams of 20% dispersed silica (Sylojet 703C, from Grace Davison, Columbia, Md.) was diluted with 36.2 grams of de-ionized water. To this solution, 5.2 grams Celvol 203S, 5.2 grams PVP K-30 and 0.1 grams of Xanthan Gum were added slowly at room temperature then mixed at high shear rate. Finally, 0.23 grams of Silwet L-7608 was added. The resultant solution was used as the masking coating/ink for printing a pattern on a substrate for metallization, e.g., as described herein.

In Embodiments C-F, the same procedure and binders of Embodiment B were used, except that the weight percent of Silica in the dried films were changed to 10% in Embodiment C, 30% in Embodiment D, 60% in Embodiment E, and 80% in Embodiment F.

For purposes of comparison, all of the masking solutions in the above-described Embodiments A-F were screen printed on to a 2 mil Melinex 453 PET film (ICI, UK) through a 330 mesh stencil to form a negative masking pattern. The roll-up properties of the printed film were evaluated by the blocking resistance at ambient and 50° C./80% RH conditions. The printed PET film was uniformly coated with an Al layer of 50 to 60 nm thickness by vapor deposition. Positive Al pattern was developed in water by selectively stripping off the Al layer on the masking layer to generate positive Al pattern on the area that was not printed with the masking layer. The stripability or stripping selectivity is determined by the sharpness and shininess of the resultant Al image. The results are listed in Table 1 below (with the embodiment to which the data in each row applies indicated by the letter in the first column):

TABLE 1

|   | Binder PVA/PVP K-30 (1:1) | Silica (wt % in dried film) | Screen Printing quality | Film Blocking at ambient condition | Film Blocking after aging in 50° C./ 80% RH | Strip-ability of Al by Water |
| --- | --- | --- | --- | --- | --- | --- |
| A | 97 | 0% | Good | Blocking | Blocking severely | Good |
| B | 92 | 5% | Good | Excellent | Good | Good |
| C | 87 | 10% | Good | Excellent | Excellent | Excellent |
| D | 67 | 30% | Good | Excellent | Excellent | Excellent |
| E | 37 | 60% | Good | Excellent | Excellent | Excellent |
| F | 17 | 80% | Fair | Excellent | Excellent | Fair-Good |

It can be seen from Table 1 that the addition of the particulate silica from 5 wt % to 80 wt % based on the dried masking film improves significantly both blocking resistance of the masking layer and the stripability of the Al layer on the masking layer. The presence of the particulate dispersion in the masking layer also resulted in highly shiny Al lines with fine line width and excellent integrity.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A process for forming a thin film structure on a substrate, comprising:
    a) printing a negative image of the thin film structure on the substrate using a strippable material consisting essentially of a binder and a re-dispersible particulate having a hydrophilic surface and an interior pore volume in the range of about 0.3 to about 3.0 ml/g, such that the strippable material is present in areas on the substrate where the thin film structure is not to be formed and the strippable material is substantially not present in areas on the substrate where the thin film structure is to be formed;
    b) depositing a thin film material on the substrate; and
    c) stripping the strippable material from the substrate;
    whereby the strippable material and any thin film material formed thereon are removed by said stripping leaving behind the thin film structure.

2. The process of claim 1, wherein the strippable material comprises 5-80% by weight of the re-dispersible particulate.

3. The process of claim 1, wherein the strippable material comprises 10-60% by weight of the re-dispersible particulate.

4. The process of claim 1, wherein the strippable material comprises a water soluble or water dispersible polymer.

5. The process of claim 4, wherein said water soluble polymer is selected from the group consisting of polyvinyl alcohol, polyvinylpyrrolidone, polyvinylpyridine, polyacrylic acid, polymethacrylic acid, polyacrylamide, polyethyleneglycol, poly(ethylene-co-maleic anhydride), poly (vinylether-co-maleic anhydride), poly(styrene-co-maleic anhydride), poly(butylene-co-itaconic acid), PEOX, polystyrene sulfonate, hydroxyethyl cellulose, hydroxypropyl cellulose, methyl cellulose, carboxymethyl cellulose, xanthan gum, gum Arabic, gelatin, lecithin and copolymers thereof.

6. The process of claim 4, wherein said water dispersible polymer is selected from the group consisting of water dispersible wax, alkaline dispersible wax, polyolefin, acrylic latexes and dispersions.

7. The process of claim 1, wherein the strippable material comprises a solvent soluble or solvent dispersible polymer.

8. The process of claim 1, wherein the re-dispersible particulate is derived from silica, $CaCO_3$, $CaSO_4$, $BaSO_4$, $Al_2O_3$, $TiO_2$, hollow-spheres, non-film-forming latexes or dispersions, inorganic pigment or organic pigment.

9. The process of claim 1, wherein the re-dispersible particulate is a polymeric particle or a polymeric composite particle.

10. The process of claim 1, wherein the strippable material comprises an additive selected from the group consisting of surfactants, dyes, curing agents and plasticizers.

11. The process of claim 1, wherein step (c) comprises using a solvent to remove the strippable material.

12. The process of claim 11, wherein the solvent is selected from the group consisting of water, aqueous solutions, alcohols, ketones, esters, ethers, amides, hydrocarbons, alkylbenzenes, pyrrolidones, sulfones, DMSO and mixtures thereof.

13. The process of claim 1, wherein step (c) comprises using mechanical pressure to remove the strippable material.

14. The process of claim 13, wherein said mechanical pressure comprises brushing.

15. The process of claim 13, wherein said mechanical pressure comprises using a spray nozzle.

16. The process claim 1, wherein step (c) comprises:
    i) applying an adhesive layer having an adhesive strength with respect to the thin film material and/or strippable material higher than that of the strippable material to the substrate; and ii) removing the strippable material and any thin film material formed thereon by peeling off the adhesive layer.

17. The process of claim 1, wherein step (c) comprises:
i) applying an adhesive layer; and
ii) removing the strippable material and any thin film material formed thereon by peeling off the adhesive layer.

18. The process of claim 17, wherein the cohesion strength of the thin film material and the adhesion strength between thin film material and the substrate are stronger than any of the three forces: the cohesion strength of the strippable material, the adhesion strength between the thin film material and the strippable material, and the adhesion strength between the strippable material and the substrate.

19. The process of claim 1, wherein the thin film material is non-conductive, semi-conductive or conductive.

20. The process of claim 19, wherein the conductive thin film material is a material selected from the group consisting of metals, metal oxides, and alloys or multilayer composites thereof.

21. The process of claim 20, wherein the metal is selected from the group consisting of aluminum, copper, zinc, tin, molybdenum, nickel, chromium, silver, gold, iron, indium, thallium, titanium, tantalum, tungsten, rhodium, palladium, platinum and cobalt.

22. The process of claim 20, wherein the metal oxide is selected from the group consisting of indium tin oxide (ITO), indium zinc oxide (IZO), aluminum zinc oxide, gadolinium indium oxide, tin oxide and fluorine-doped indium oxide.

23. The process of claim 1, wherein step (b) comprises sputtering, vapor deposition, vacuum deposition, electroplating, electro-less plating or electroforming.

24. The process of claim 1, wherein step (a) comprises flexographic printing, driographic printing, electrophotographic printing, lithographic printing, gravure printing, thermal printing, inkjet printing or screen printing.

25. The process of claim 1, wherein the substrate comprises a plastic substrate.

26. The process of claim 25, wherein the thin film structure comprises a flexible printed circuit board or a portion of a flexible printed circuit board.

27. The process of claim 1, wherein the thin film structure comprises an electrode.

28. The process of claim 27, wherein the electrode is a segment electrode, column electrode, row electrode or pixel electrode.

29. The process of claim 1, wherein the thin film structure comprises a conductive trace.

30. The process of claim 1, further comprising forming a second thin film structure on the substrate by repeating steps (a), (b) and (c) in a different area of the substrate.

31. The process of claim 30, wherein the step (a) for forming the second thin film structure is carried out separately from the step (a) of claim 1, and the steps (b) and (c) for forming the second thin film structure are carried out together with the steps (b) and (c) of claim 1.

32. The process of claim 1, wherein said re-dispersible particulate has a pore volume in the range of about 0.7 to about 2.0 ml/g.

* * * * *